(12) United States Patent
van der Straten et al.

(10) Patent No.: US 12,289,896 B2
(45) Date of Patent: Apr. 29, 2025

(54) MAGNETO-RESISTIVE RANDOM ACCESS MEMORY WITH SEGMENTED BOTTOM ELECTRODE

(71) Applicant: International Business Machines Corporation, Armonk, NY (US)

(72) Inventors: Oscar van der Straten, Guilderland Center, NY (US); Willie Lester Muchrison, Jr., Troy, NY (US); Lisamarie White, Staatsburg, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 620 days.

(21) Appl. No.: 17/644,449

(22) Filed: Dec. 15, 2021

(65) Prior Publication Data
US 2023/0189535 A1    Jun. 15, 2023

(51) Int. Cl.
*H10B 61/00* (2023.01)
*H10N 50/01* (2023.01)
*H10N 50/80* (2023.01)
*H10N 50/85* (2023.01)

(52) U.S. Cl.
CPC ............ *H10B 61/00* (2023.02); *H10N 50/01* (2023.02); *H10N 50/80* (2023.02); *H10N 50/85* (2023.02)

(58) Field of Classification Search
CPC ........ H10B 61/00; H10N 50/01; H10N 50/80; H10N 50/85; H10N 50/10
See application file for complete search history.

(56) References Cited

U.S. PATENT DOCUMENTS

| | | | |
|---|---|---|---|
| 7,936,027 B2 | 5/2011 | Xiao | |
| 8,772,888 B2 | 7/2014 | Jung | |
| 8,828,742 B2 | 9/2014 | Yoshihisa | |
| 9,166,154 B2 | 10/2015 | Satoh | |
| 9,583,697 B2 * | 2/2017 | Kim | ........................ H10N 50/01 |
| 10,096,649 B2 | 10/2018 | Park | |
| 10,833,257 B1 | 11/2020 | Dutta | |
| 11,024,670 B1 * | 6/2021 | Reznicek | ............... H10N 50/01 |
| 2010/0311243 A1 | 12/2010 | Mao | |
| 2011/0049655 A1 | 3/2011 | Assefa | |

(Continued)

FOREIGN PATENT DOCUMENTS

EP    3591703 A1    1/2020

OTHER PUBLICATIONS

Yu, et al., "Novel Vertical 3D Structure of TaOx-based RRAM with Self-localized Switching Region by Sidewall Electrode Oxidation", Scientific Reports, vol. 6, Article No. 21020, 2016, 10 pages, <https://www.nature.com/articles/srep21020/>.

*Primary Examiner* — Victor A Mandala
(74) *Attorney, Agent, or Firm* — Matthew Zehrer

(57) ABSTRACT

A magneto-resistive random access memory with segmented bottom electrode includes a magnetic tunnel junction pillar above a first portion of a bottom electrode layer, the first portion of the bottom electrode layer includes a metal region. A sidewall spacer is disposed along sidewalls of the magnetic tunnel junction pillar and above a second portion of the bottom electrode layer including a metal-oxide region. The first portion of the bottom electrode layer composed of the metal region and the second portion of the bottom electrode layer composed of the metal-oxide region form the segmented bottom electrode.

20 Claims, 16 Drawing Sheets

(56) References Cited

U.S. PATENT DOCUMENTS

| | | |
|---|---|---|
| 2011/0133300 A1 | 6/2011 | Xiao |
| 2015/0014800 A1 | 1/2015 | Satoh |
| 2016/0035969 A1* | 2/2016 | Kang ..................... H10B 61/10 |
| | | 257/421 |
| 2021/0111333 A1 | 4/2021 | Yao-Wen |
| 2023/0060906 A1* | 3/2023 | Xie ........................ H10N 50/80 |
| 2023/0200086 A1* | 6/2023 | van der Straten ..... H10B 61/00 |
| | | 257/421 |
| 2023/0371394 A1* | 11/2023 | van der Straten .... G11C 11/161 |
| 2023/0402078 A1* | 12/2023 | van der Straten .... G11C 11/161 |

* cited by examiner

MAGNETO-RESISTIVE RANDOM ACCESS MEMORY WITH SEGMENTED BOTTOM ELECTRODE

BACKGROUND

The present invention generally relates to the field of magnetic storage devices, and more particularly to high performance magneto-resistive random access memory devices.

Magneto-resistive random access memory (MRAM) is a non-volatile random access memory technology in which data is stored by magnetic storage elements. These magnetic storage elements are typically formed from two ferromagnetic plates, each of which can hold a magnetization, separated by a thin dielectric layer, i.e., the tunnel barrier. One of the two plates is a permanent magnet set to a particular polarity; the other plate's magnetization can be changed to match that of an external field to store memory. Such configuration is known as a magnetic tunnel junction (MTJ) pillar.

For high performance MRAM devices based on perpendicular MTJ pillars, well-defined interfaces and interface control are essential. Embedded MTJ pillar structures are usually formed by patterning of blanket MTJ stacks. Reactive-ion etch (RIE), and ion-beam etch (IBE) processing of such MTJ stacks presents a major challenge, as it typically leads to electrical shorts due to re-sputtering of underlying thick bottom metal layers onto MTJ stack sidewalls.

SUMMARY

Therefore, there is a need for improved designs and techniques that can prevent the deposition of re-sputtered conductive metal particles from underlying (thick) bottom metal layers on sidewalls of the MTJ stack.

Shortcomings of the prior art are overcome and additional advantages are provided through the provision of a memory device that includes a magnetic tunnel junction pillar above a first portion of a segmented bottom electrode including a metal region, and a sidewall spacer disposed along sidewalls of the magnetic tunnel junction pillar, the sidewall spacer being above a second portion of the segmented bottom electrode including a metal-oxide region.

Another embodiment of the present disclosure provides a memory device that includes a magnetic tunnel junction pillar above a first portion of a segmented bottom electrode including a metal region, a metal-oxide layer disposed along sidewalls of the magnetic tunnel junction pillar, the metal-oxide layer including a re-sputtered metal oxide from a second portion of the segmented bottom electrode located outside the magnetic tunnel junction pillar, and a sidewall spacer located above the metal-oxide layer.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1A:
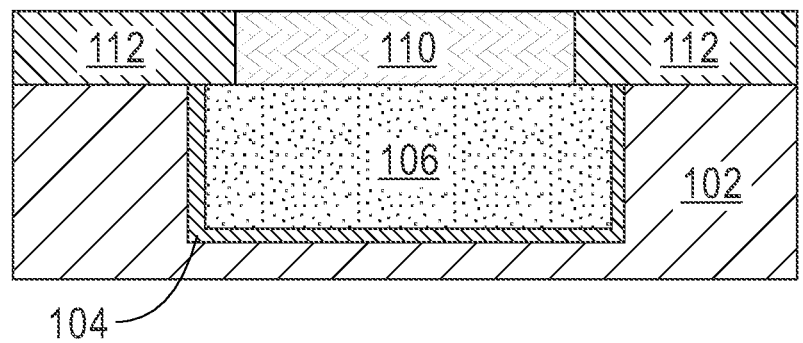
FIG. 1A is a cross-sectional view of a memory device at an intermediate step during a semiconductor manufacturing process, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

MRAM devices include cells or magnetic storage elements for storing data having a magnetically hard layer (i.e., the reference layer) and a magnetically soft layer (i.e., the free layer) separated by a thin dielectric layer (i.e., the tunnel barrier). This configuration is known as a magnetic tunnel junction (MTJ) pillar. MTJ pillar structures typically include a cobalt (Co)-based synthetic anti-ferromagnet (SAF), a CoFeB-based reference layer, a MgO-based tunnel barrier, a CoFeB-based free layer, and cap layers containing materials such as tantalum (Ta) and/or ruthenium (Ru). As mentioned above, embedded MTJ pillar structures are usually formed by patterning of blanket MTJ stacks. Reactive-ion etch (RIE) and ion beam etch (IBE) processing of such MTJ stacks presents a major challenge, as it typically leads to shorts due to re-sputtering of thick bottom metal layers onto sidewalls of the MTJ stack.

Embodiments of the present disclosure provide a memory device, and a method of making the same, in which a segmented bottom electrode consisting of a metal layer underneath the MTJ pillar and a metal-oxide layer outside the MTJ pillar can be formed for preventing re-sputtering of thick bottom metal layers onto sidewalls of the MTJ stack. Specifically, the proposed embodiments provide a segmented bottom electrode composed of a single metal layer (e.g., Ta, Mo, etc.) or a metal/metal nitride bilayer (e.g., Ta/TaN, Mo/MoN, W/WN, etc.) underneath the MTJ pillar. The metal-oxide layer outside the MTJ pillar consists of the oxide of the adjacent metal layer, such as TaOx in case of a Ta bottom metal layer. The bottom electrode region outside the MTJ pillar is oxidized by thermal or plasma oxidation, prior to the formation of the MTJ pillar. Additionally, since the proposed embodiments enable re-sputtering of the metal-oxide layer, in some embodiments, a re-sputtered metal-oxide (such as TaOx), or a bilayer of re-sputtered metal-oxides (such as TaNOx/TaOx) can be formed on the MTJ pillar sidewalls. Thus, embodiments of the present disclosure can prevent re-sputtering of thick bottom metal layers onto sidewalls of the MTJ stack thereby reducing the risk of electrical shorts and increasing device reliability.

An embodiment by which a memory device with segmented bottom electrode can be formed is described in detailed below by referring to the accompanying drawings in FIGS. 1A-2D. Another embodiment by which the memory device with segmented bottom electrode can be formed is described in detailed below by referring to the accompanying drawings in FIGS. 3A-4D.

Referring now to FIG. 1A, a cross-sectional view of a memory device 100 at an intermediate step during a semiconductor manufacturing process is shown, according to an embodiment of the present disclosure. The memory device 100 may include any MTJ-containing device such as, for example, MRAM, spin-transfer torque (STT) MRAM, spin-orbit torque (SOT) MRAM and the like. In the embodiment of FIG. 1, the memory device 100 is an MRAM device based on a perpendicular MTJ pillar structure.

The memory device 100 includes a first conductive structure 106 that is embedded in an interconnect dielectric material or first dielectric layer 102. A first diffusion barrier liner 104 can be formed on sidewalls and a bottom surface of the first conductive structure 106, as shown in the figure. Collectively, the first conductive structure 106, the first diffusion barrier liner 104, and the first dielectric layer 102 provide an interconnect level. It should be noted that at least one other interconnect level and/or a middle-of-the-line (MOL) level may be located beneath the interconnect level formed by the first dielectric layer 102, the first conductive structure 106, and the first diffusion barrier liner 104. These other levels are not shown for clarity.

The first dielectric layer 102 can be composed of any interconnect dielectric material including, for example, silicon dioxide, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first conductive structure 106 is composed of an electrically conductive metal or metal alloy. Examples of electrically conductive materials that may be used in the present application include copper (Cu), aluminum (Al), or tungsten (W), while an example of an electrically conductive metal alloy is a Cu—Al alloy.

As depicted in the figure, the first diffusion barrier liner 104 is formed along a bottom surface and sidewalls of the first conductive structure 106. In some embodiments, no diffusion barrier liner is present. The first diffusion barrier liner 104 is composed of a diffusion barrier material (i.e., a material that serves as a barrier to prevent a conductive material such as copper from diffusing there through). Examples of diffusion barrier materials that can be used in providing the first diffusion barrier liner 104 may include, but are not limited to, Ta, TaN, Ti, TiN, Ru, RuN, RuTa, RuTaN, W, or WN. In some embodiments, the first diffusion barrier liner 104 may include a stack of diffusion barrier materials. In one example, the diffusion barrier material may be composed of a stack of Ta/TaN.

The interconnect level including the first dielectric layer 102, the first conductive structure 106, and the first diffusion barrier liner 104 may be formed utilizing conventional processes that are well-known to those skilled in the art including, for example, a damascene process. So as not to obscure the method of the present application, the techniques used to form the interconnect level including the first dielectric layer 102, the first conductive structure 106, and the first diffusion barrier liner 104 are not provided herein.

The memory device 100 may further include a metal cap 110 formed within a second dielectric layer 112, as depicted in the figure. In one or more embodiments, the second dielectric layer 112 include analogous materials and is formed in a similar way as the first dielectric layer 102. The metal cap 110 may be provided in cases where the first conductive structure 106 includes a reactive metal such as copper (Cu). In such cases, the metal cap 110 may include a less reactive capping material such as, for example, TaN, WN, and the like. The process of forming the metal cap 110 is standard and well-known in the art. Generally, the process includes depositing the second dielectric layer 112 above the first conductive structure 106 and the first dielectric layer 102, forming a via or trench feature (not shown) in the second dielectric layer 112 using standard patterning (lithography) and etching techniques until exposing the first conductive structure 106, and then filling the via or trench feature with the capping material using well-known conformal deposition processes, such as atomic layer deposition (ALD), or chemical vapor deposition (CVD). A thickness of the metal cap 110 may vary from approximately 5 nm to approximately 200 nm, and ranges therebetween.

Figure 1B:
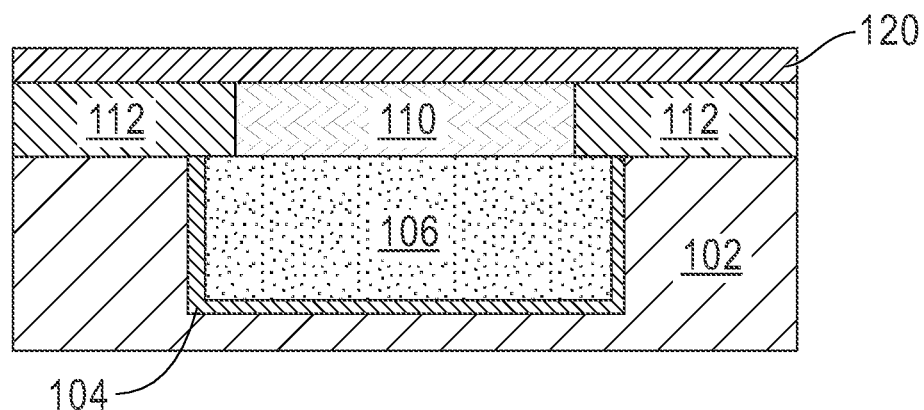
FIG. 1B is a cross-sectional view of the memory device after forming a bottom electrode, according to an embodiment of the present disclosure.

Referring now to FIG. 1B, a cross-sectional view of the memory device 100 is shown after forming a bottom electrode 120, according to an embodiment of the present disclosure.

The bottom electrode 120 is formed above top surfaces of the metal cap 110 and second dielectric layer 112. In this embodiment, the bottom electrode 120 may include a layer of an electrically conductive material such as, for example, Ta, TaN, Ti, TiN, Ru, RuN, RuTa, RuTaN, W, WN or any combination thereof. The bottom electrode 120 may be formed by a deposition process such as, for example, sputtering, atomic layer deposition (ALD), chemical vapor deposition (CVD), plasma enhanced chemical vapor deposition (PECVD) or physical vapor deposition (PVD). An etch back process, a planarization process (such as, for example, chemical mechanical polishing), or a patterning process (such as, for example, lithography and etching) may follow the deposition of the electrically conductive material that provides the bottom electrode 120. The bottom electrode 120 may have a thickness varying from approximately 2 nm to approximately 25 nm and ranges there between, although a thickness less than 2 nm and greater than 25 nm may be acceptable.

Figure 1C:
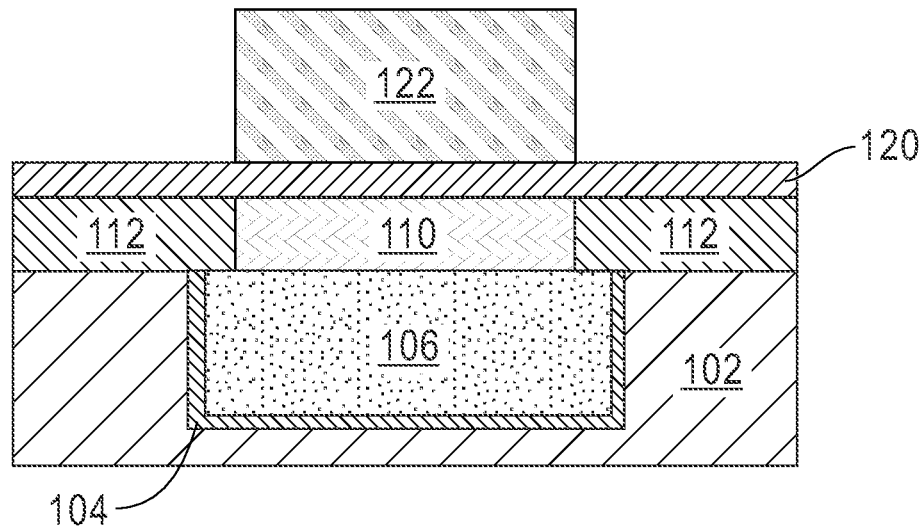
FIG. 1C is a cross-sectional view of the memory device after forming a first sacrificial pillar, according to an embodiment of the present disclosure.

Referring now to FIG. 1C, a cross-sectional view of the memory device 100 is shown after forming a first sacrificial pillar 122, according to an embodiment of the present disclosure.

At this step of the fabrication process, a layer of dielectric material is formed above the bottom electrode 120 using any suitable deposition technique. The deposited layer of dielectric material is then patterned to form the first sacrificial pillar 122 using standard patterning (lithography) and etching techniques. Non-limiting examples of dielectric materials to form the first sacrificial pillar 122 may include silicon oxide, silicon nitride, hydrogenated silicon carbon oxide, or silicon based low-k dielectrics. In this embodiment, the first sacrificial pillar 122 may protect underlying portions of the bottom electrode 120 during a subsequent oxidation process. According to an embodiment, a (horizontal) thickness of the first sacrificial pillar 122 may be selected based on design requirements and may vary between approximately 10 nm to approximately 200 nm, although other thicknesses above or below this range may be used as desired for a particular application.

Figure 1D:
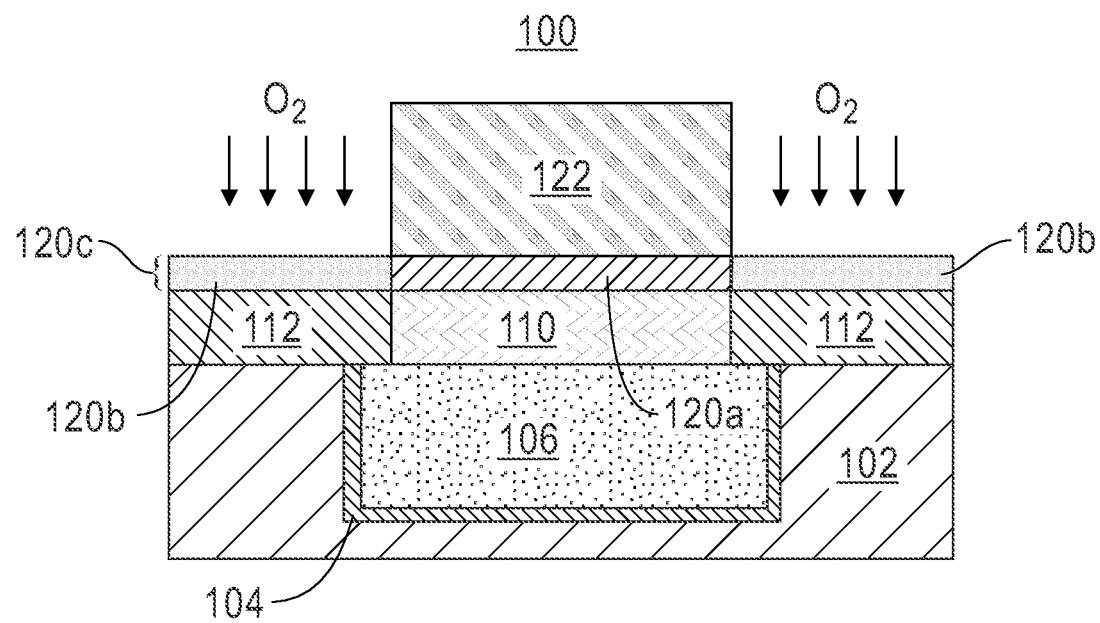
FIG. 1D is a cross-sectional view of the memory device after conducting an oxidation process on the bottom electrode, according to an embodiment of the present disclosure.

Referring now to FIG. 1D, a cross-sectional view of the memory device 100 is shown after conducting an oxidation process on the bottom electrode 120, according to an embodiment of the present disclosure.

The oxidation process is conducted on exposed (outer) portions of the bottom electrode 120 (i.e., regions of the bottom electrode 120 not covered by the first sacrificial pillar 122). As described above, the first sacrificial pillar 122 protects underlying (inner) portions of the bottom electrode 120 during the oxidation process. In one or more embodiments, the oxidation process includes thermal/plasma exposure of the outer portions of the bottom electrode 120 to $O_2$, $H_2O$ and/or $NO_x$ in the presence of the first sacrificial pillar 122, as indicated by the arrows in FIG. 1D.

After completing the oxidation process, the bottom electrode 120 depicted in FIG. 1C becomes a segmented bottom electrode 120c composed of an (inner) metal region 120a located underneath the sacrificial pillar 122 and (outer) metal-oxide regions 120b (i.e., oxidized portions of the bottom electrode 120). For example, in embodiments in which the bottom electrode 120 (FIG. 1C) includes Ta, after the oxidation process the metal region 120a under the sacrificial pillar 122 is composed of Ta and the metal-oxide regions 120b not covered by the first sacrificial pillar 122 are composed of $TaO_x$.

It should be noted that by forming the metal-oxide regions 120b, back-sputtering of conductive metal particles during etching of a subsequently formed MTJ stack can be prevented, as will be described in detail below.

Figure 1E:
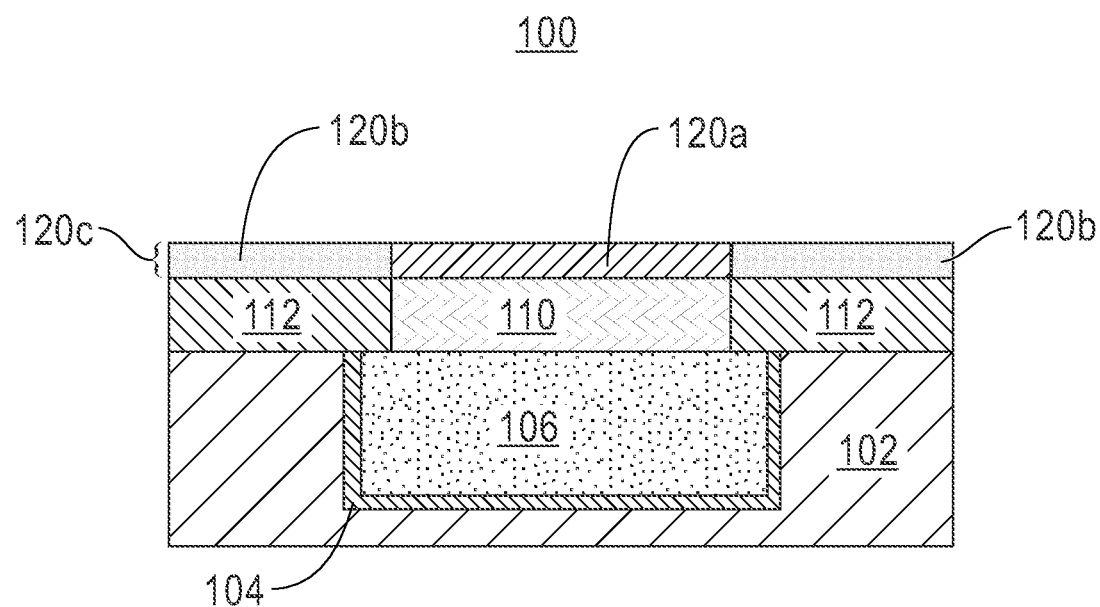
FIG. 1E is a cross-sectional view of the memory device after removing the first sacrificial pillar, according to an embodiment of the present disclosure.

Referring now to FIG. 1E, a cross-sectional view of the memory device 100 is shown after removing the first sacrificial pillar 122, according to an embodiment of the present disclosure. The first sacrificial pillar 122 can be removed using any suitable etching technique such as, for example, reactive ion etching (RIE). Removal of the first sacrificial pillar 122 exposes an uppermost surface of the segmented bottom electrode 120c.

Figure 1F:
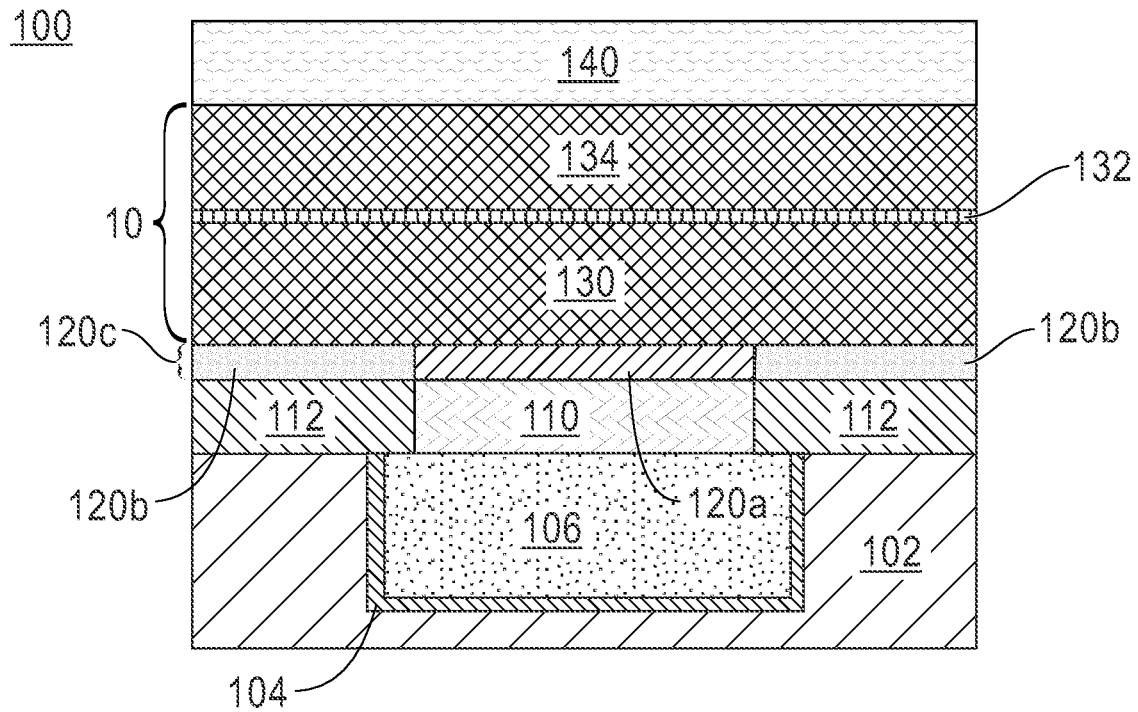
FIG. 1F is a cross-sectional view of the memory device after forming a magnetic tunnel junction stack and a hardmask layer, according to an embodiment of the present disclosure.

Referring now to FIG. 1F, a cross-sectional view of the memory device 100 is shown after forming an MTJ stack 10 above the segmented bottom electrode 120c, according to an embodiment of the present disclosure. The MTJ stack 10 may include at least a magnetic reference layer 130, a tunnel barrier layer 132, and a magnetic free layer 134 as depicted in the figure. It should be noted that other configurations are possible for the MTJ stack 10 including, for example, the magnetic free layer 134 being located at the bottom of the MTJ stack 10 and the magnetic reference layer 130 being at the top of the MTJ stack 10.

In some embodiments, the MTJ stack 10 may also include a non-magnetic spacer layer (not shown) located on the magnetic free layer, a second magnetic free layer located on the non-magnetic spacer layer, and/or a MTJ cap layer located on the magnetic free layer 134 or on the second magnetic free layer. The various material layers of the MTJ stack 10 can be formed by utilizing one or more deposition processes such as, for example, plating, sputtering, plasma enhanced atomic layer deposition (PEALD), plasma enhanced chemical vapor deposition (PECVD) or physical vapor deposition (PVD).

The magnetic reference layer 130 has a fixed magnetization. The magnetic reference layer 130 may be composed of a metal or metal alloy (or a stack thereof) that includes one or more metals exhibiting high spin polarization. In alternative embodiments, exemplary metals for the formation of the magnetic reference layer 130 may include iron, nickel, cobalt, chromium, boron, or manganese. Exemplary metal alloys may include the metals exemplified by the above. In another embodiment, the magnetic reference layer 130 may be a multilayer arrangement having (1) a high spin polarization region formed from a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

The tunnel barrier layer 132 is composed of an insulator material and is formed at such a thickness as to provide an appropriate tunneling resistance. Exemplary materials for the tunnel barrier layer 132 may include magnesium oxide, aluminum oxide, and titanium oxide, or materials of higher electrical tunnel conductance, such as semiconductors or low-bandgap insulators.

The magnetic free layer 134 may be composed of a magnetic material (or a stack of magnetic materials) with a magnetization that can be changed in orientation relative to the magnetization orientation of the magnetic reference layer 130. Exemplary magnetic materials for the magnetic free layer 134 include alloys and/or multilayers of cobalt, iron, alloys of cobalt-iron, nickel, alloys of nickel-iron, and alloys of cobalt-iron-boron.

With continued reference to FIG. 1F, a hardmask layer 140 can be subsequently deposited above the magnetic free layer 134 of the MTJ stack 10, as depicted in the figure.

According to an embodiment, the hardmask layer 140 may be composed of a metal such as TaN, TaAlN, WN as the bottommost material, and a dielectric material such as silicon dioxide, silicon nitride, silicon carbide, and the like, as the topmost material. For ease of illustration the hardmask layer 140 is depicted as being composed of only one layer. The hardmask layer 140 can be deposited by any suitable deposition method known in the art. It should be noted that the metal layer in the hardmask layer 140 is not sacrificial, while the dielectric layer in the hardmask layer 140 is sacrificial, in that the dielectric layer will be removed after completion of the patterning process. In some embodiments, top layers (not shown) of the MTJ stack 10 may act as both a hardmask for etching the MTJ stack 10 and as an interlayer conductor channel. A (vertical) thickness of the hardmask layer 140 may vary between approximately 10 nm to approximately 100 nm, although other thicknesses above or below this range may be used as desired for a particular application.

Figure 1G:
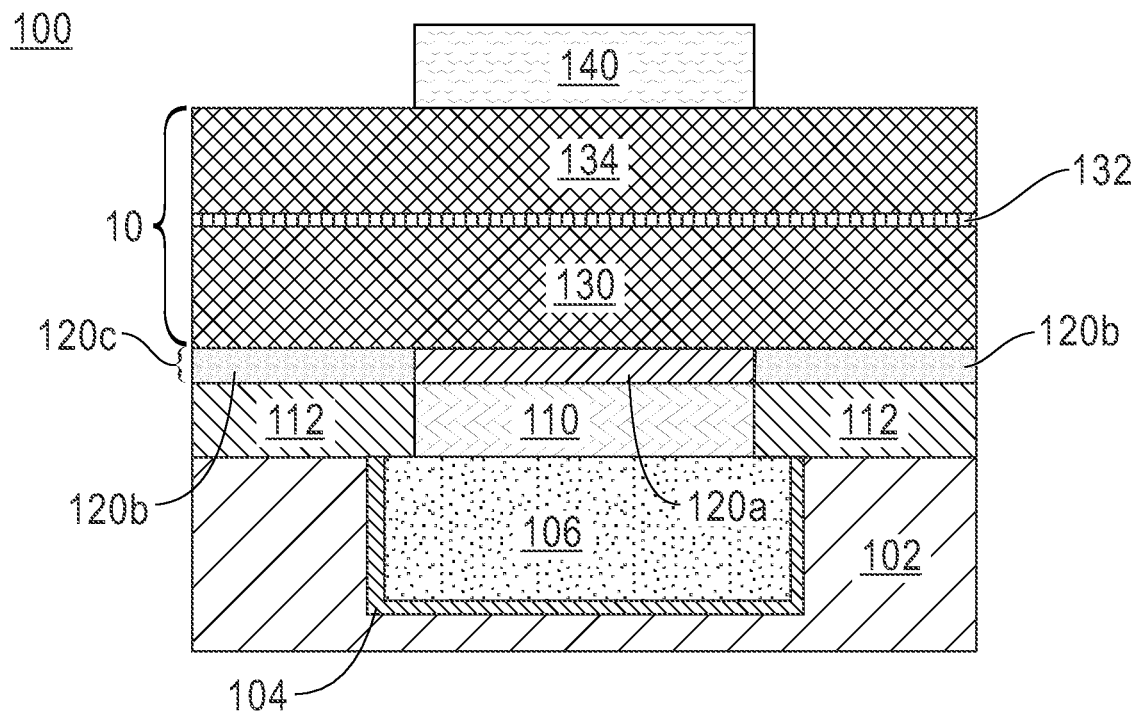
FIG. 1G is a cross-sectional view of the memory device after patterning the hardmask layer, according to an embodiment of the present disclosure.
Figure 1H:
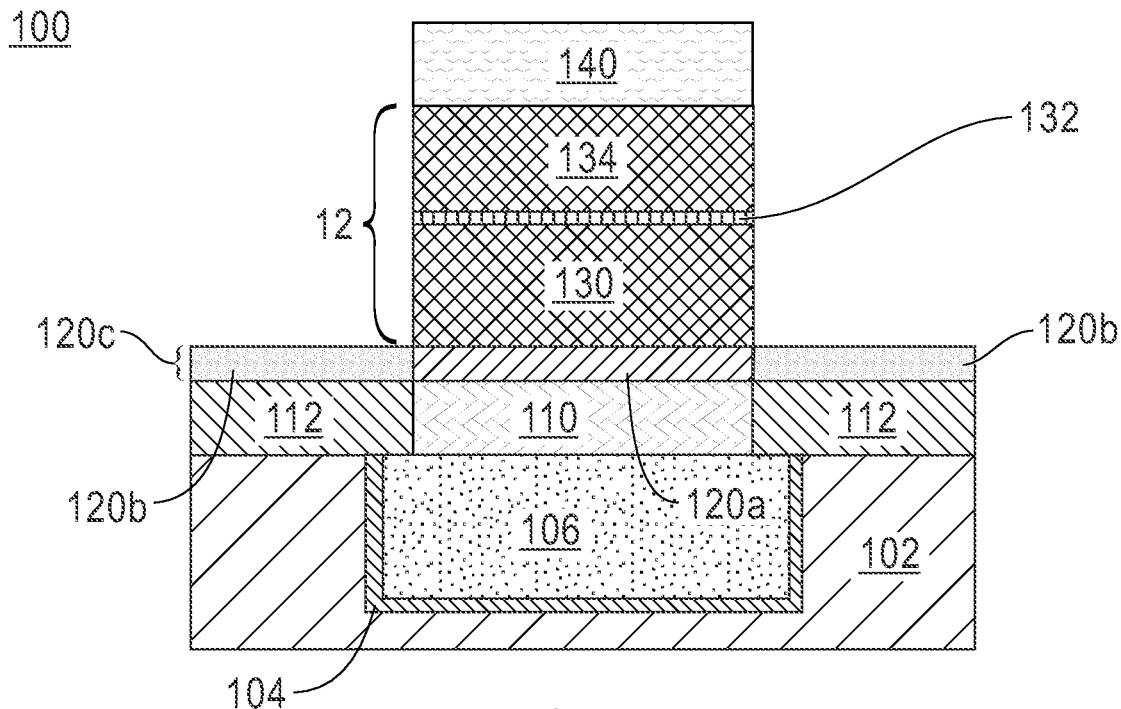
FIG. 1H is a cross-sectional view of the memory device after patterning the magnetic tunnel junction stack to form a magnetic tunnel junction pillar, according to an embodiment of the present disclosure.

Referring now to FIG. 1G and FIG. 1H simultaneously, cross-sectional views of the memory device 100 are shown after patterning the hardmask layer 140 and the MTJ stack 10 to form an MTJ pillar 12, according to an embodiment of the present disclosure.

The process of patterning the hardmask layer 140 and the MTJ stack 10 consists of steps well-known in the art, which generally include forming a pattern on a photoresist layer (not shown) that is transferred to the hardmask layer 140 (FIG. 1G) and used to pattern the underlying MTJ stack 10 (FIG. 1G) via any suitable etching technique. Non-limiting examples of etching techniques for patterning the MTJ stack 10 (FIG. 1G) may include reactive-ion etching (RIE) or ion beam etching (IBE). In this embodiment, etching of the MTJ stack 10 (FIG. 1G) is conducted until a top surface of the metal-oxide regions 120b. As previously mentioned, the metal-oxide regions 120b of the segmented bottom electrode 120c can prevent back-sputtering of conductive metal particles during etching of the MTJ stack 10 (FIG. 1G) to form the MTJ pillar 12.

It should be noted that some elements and/or features of the memory device 100 are illustrated in the figures but not described in detail in order to avoid unnecessarily obscuring the presented embodiments. For illustration purposes only, without intent of limitation, only one MTJ pillar 12 with a corresponding (segmented) bottom electrode 120c is depicted in the figure. As may be understood by those skilled in the art, more than one MTJ pillar 12 can be formed in the memory device 100.

Figure 1I:
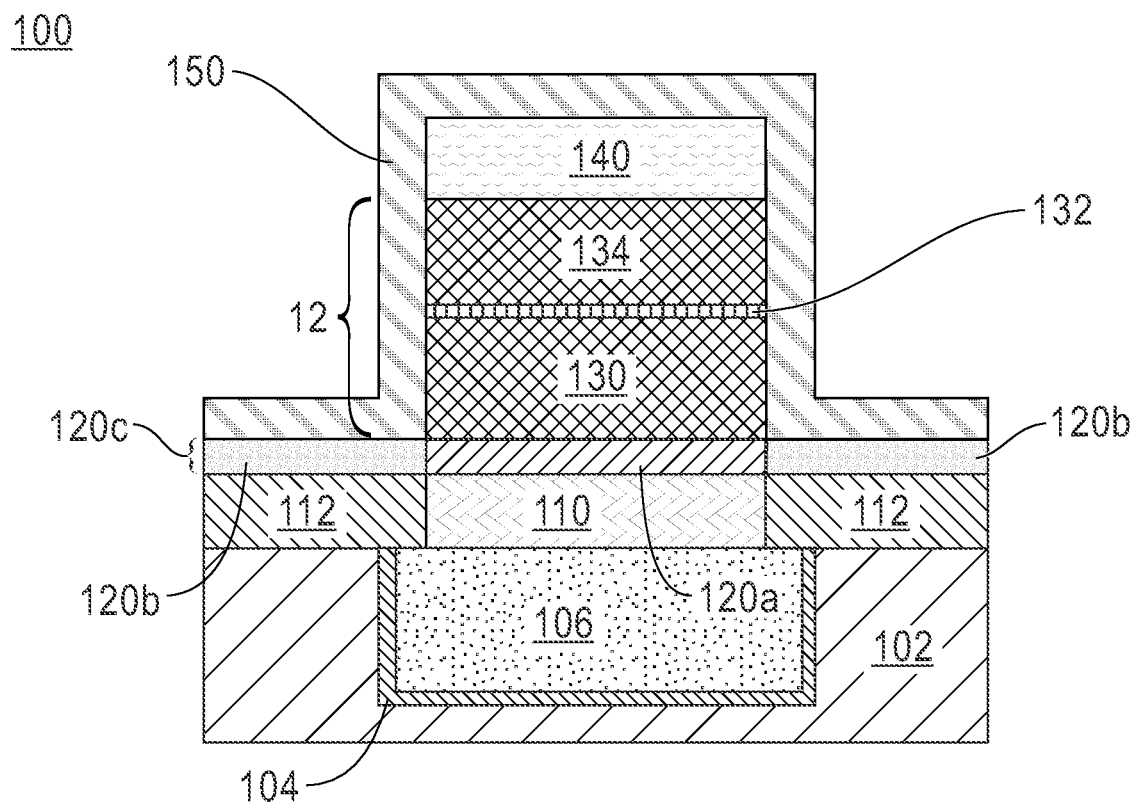
FIG. 1I is a cross-sectional view of the memory device after forming a spacer material, according to an embodiment of the present disclosure.

Referring now to FIG. 1I, a cross-sectional view of the memory device 100 is shown after forming a spacer material 150, according to an embodiment of the present disclosure.

The spacer material 150 may include an insulator material such as an oxide, nitride, oxynitride, silicon carbon oxynitride, silicon boron oxynitride, low-k dielectric, or any combination thereof. Standard conformal deposition techniques may be used to form the spacer material 150. The spacer material 150 can be deposited on the memory device 100 and then etched to form sidewall spacers, as will be described in detail below.

Figure 1J:
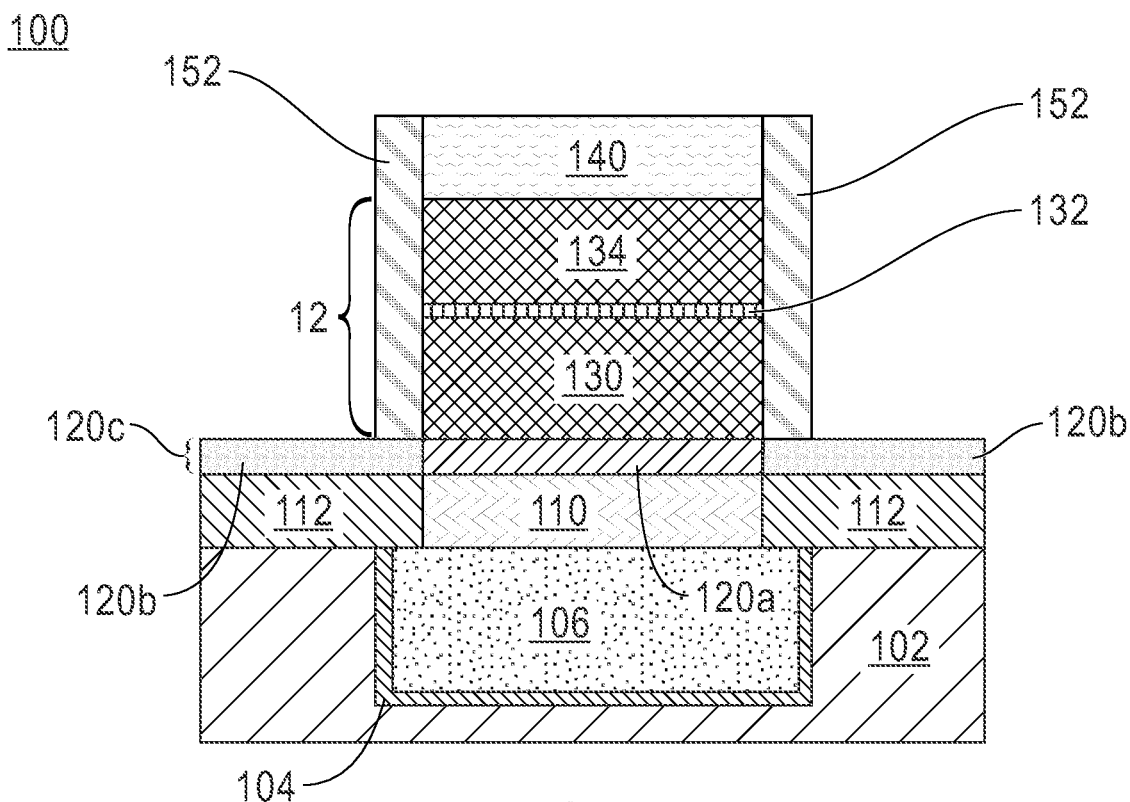
FIG. 1J is a cross-sectional view of the memory device after etching the spacer material and forming sidewall spacers, according to an embodiment of the present disclosure.

Referring now to FIG. 1J, a cross-sectional view of the memory device 100 is shown after etching the spacer material 150 and forming sidewall spacers 152, according to an embodiment of the present disclosure. The spacer material 150 (FIG. 1I) can be etched using, for example, an anisotropic etch to form the sidewall spacers 152. As depicted in the figure, the spacer material 150 (FIG. 1I) is removed from all horizontal surfaces of the memory device 100 during the etching process.

According to an embodiment, the sidewall spacers 152 are located along sidewalls of the MTJ pillar 12 and hardmask layer 140 substantially covering this region of the memory device 100. Stated differently, the sidewall spacers 152 act as an encapsulation material that surrounds and protects the MTJ pillar 12 during subsequent processing steps. As can be observed in the figure, a bottom surface of the sidewall spacers 152 is in contact with a portion of the metal-oxide regions 120b of the segmented bottom electrode 120c. In an exemplary embodiment, a thickness of the sidewall spacers 152 may vary between approximately 3 nm to approximately 40 nm, although other thicknesses above or below this range may be used as desired for a particular application.

Figure 1K:
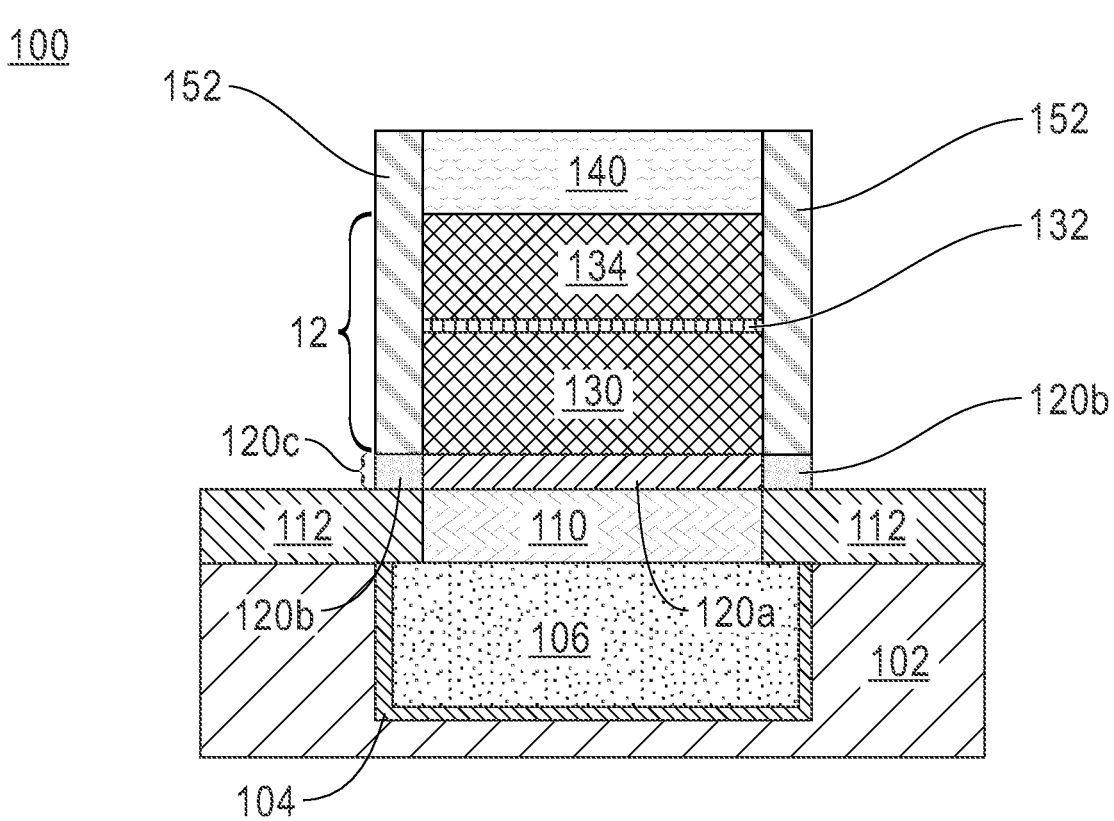
FIG. 1K is a cross-sectional view of the memory device after etching outer portions of metal-oxide regions, according to an embodiment of the present disclosure.

Referring now to FIG. 1K, a cross-sectional view of the memory device 100 is shown after etching outer portions of the metal-oxide regions 120b of the segmented bottom electrode 120c, according to an embodiment of the present disclosure.

In this embodiment, dry etching techniques such as reactive ion etch (RIE) or ion beam etch (IBE) can be used to etch (outer) portions of the metal-oxide regions 120b of the segmented bottom electrode 120c that extend outwards from the sidewall spacers 152. Stated differently, areas of the metal-oxide regions 120b not covered by the sidewalls spacers 152 are removed from the memory device 100. It should be noted that areas of the metal-oxide regions 120b underneath the sidewalls spacers 152 remain in the memory device 100.

Figure 1L:
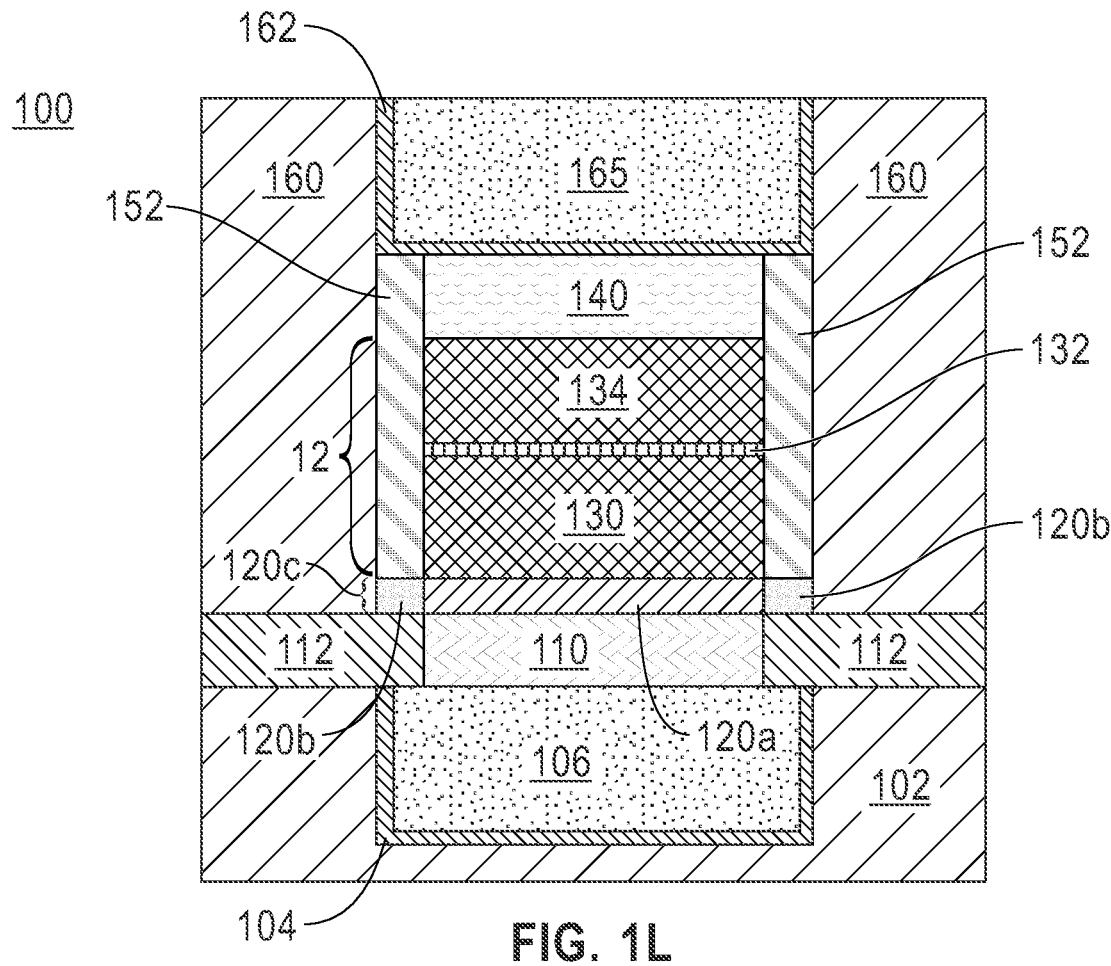
FIG. 1L is a cross-sectional view of the memory device after forming a third dielectric layer and a second conductive structure, according to an embodiment of the present disclosure.

Referring now to FIG. 1L, a cross-sectional view of the memory device 100 is shown after forming a dielectric filling layer or third dielectric layer 160 and a second conductive structure 165, according to an embodiment of the present disclosure. The third dielectric layer 160 may be made of analogous materials and formed in similar ways as the first dielectric layer 102 and second dielectric layer 112.

In some embodiments, a planarization process may be conducted on the memory device 100 after deposition of the third dielectric layer 160.

The second conductive structure 165 may be formed in the third dielectric layer 160 in accordance with typical techniques. The second conductive structure 165 may consist of a line or wire found in a typical semiconductor circuit. According to an embodiment, the second conductive structure 165 may be fabricated using, for example, a dual damascene technique in which a conductive interconnect material may be deposited within a trench (not shown) formed in the second dielectric layer 160. In one embodiment, the second conductive structure 165 may include a second diffusion barrier liner 162 formed on a bottom surface and sidewalls of the second conductive structure 165, as shown in the figure. Similar to the first conductive structure 106, the second conductive structure 165 may be composed of a conductive interconnect material such as Cu, Al, or W, while the second barrier liner 162 may include Ta, TaN, Ti, TiN, Ru, RuN, RuTa, RuTaN, W, or WN. The conductive interconnect material may be formed using a filling technique such as electroplating, electroless plating, chemical vapor deposition, physical vapor deposition or a combination of methods. A seed layer (not shown) may optionally be deposited prior to filling the trench using an electroplating technique. In one or more embodiments, a planarization process is conducted after forming the second conductive structure 165.

Accordingly, the previously described embodiments provide a memory device 100 having a segmented bottom electrode 120 consisting of a metal layer (i.e., metal region 120a) underneath the MTJ pillar 12 and a metal-oxide layer (i.e., metal-oxide regions 120b) outside the MTJ pillar 12 below the sidewall spacers 152. In the embodiments of FIGS. 1A-1L, the bottom metal layer may be composed of a single metal (such as Ta, Mo, etc.) and the metal-oxide layer outside the MTJ pillar 12 may be composed of the oxide of the adjacent metal layer, such as TaOx in the case of a bottom metal layer made of Ta.

Alternatively or additionally, a re-sputtering process of the exposed metal-oxide regions 120b of the segmented bottom electrode 120c depicted in FIG. 1H can be performed after conducting the steps of forming the segmented bottom electrode 120c and patterning the MTJ stack 10 (FIGS. 1D-1H), as will be described in detail below with reference to FIGS. 2A-2D.

Referring now to FIGS. 2A-2D simultaneously, cross-sectional views of the memory device 100 are shown after re-sputtering of the exposed metal-oxide regions 120b of the segmented bottom electrode 120c depicted in FIG. 1H, according to an alternate embodiment of the present disclosure.

After conducting the steps of forming the segmented bottom electrode 120c and patterning the MTJ pillar 12 as described in FIGS. 1D-1H, the exposed metal-oxide regions 120b of the segmented bottom electrode 120c depicted in FIG. 1H can be re-sputtered onto sidewalls of the MTJ pillar 12 to form a first metal-oxide layer 225, as depicted in the figure.

In an embodiment, the re-sputtered metal-oxide (e.g., TaOx) from the exposed metal-oxide regions 120b of the segmented bottom electrode 120c as depicted in FIG. 1H may deposit on sidewalls of the MTJ pillar 12. More particularly, in one or more embodiments, the etching process used to pattern the MTJ pillar 12 (described above with reference to FIG. 1H) may continue until a top surface of the second dielectric layer 112 substantially consuming the exposed metal-oxide regions 120b (FIG. 1H). By doing this, the re-sputter metal-oxide from metal-oxide regions 120b (FIG. 1H) may deposit along sidewalls of the MTJ pillar 12 forming the first metal-oxide layer 225, as illustrated by first arrows 220 in FIG. 2A. The first metal-oxide layer 225 may help preventing shorts across the tunnel barrier of the MTJ pillar 12.

Figure 2A:
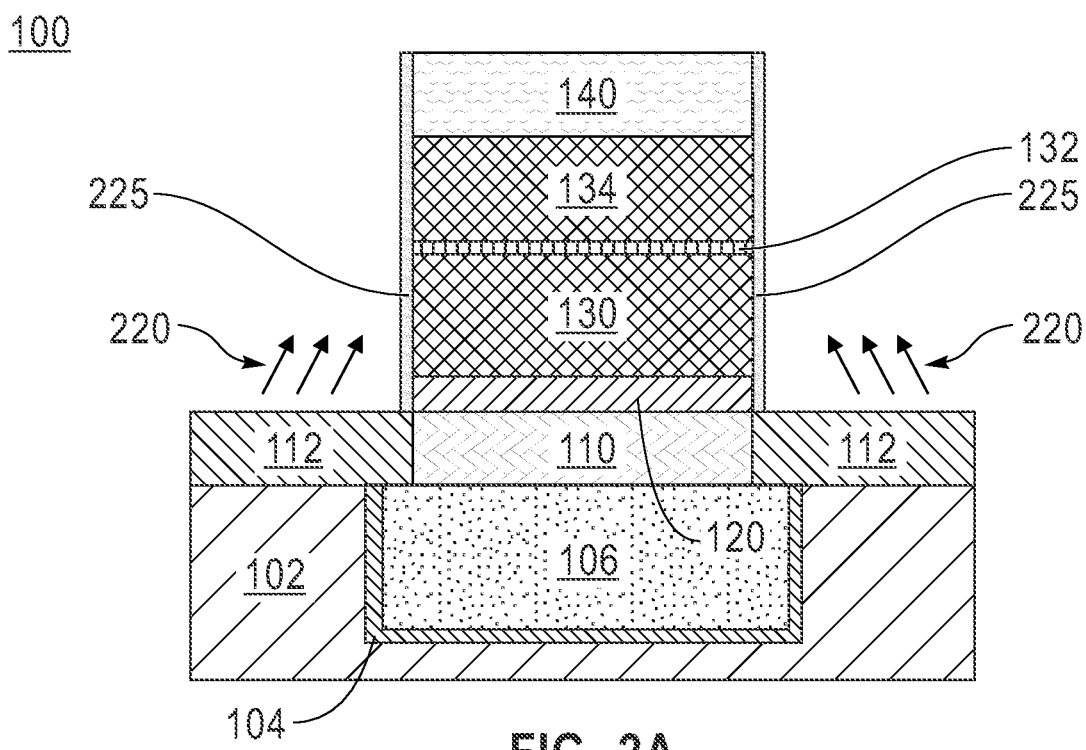
FIG. 2A is a cross-sectional view of the memory device after re-sputtering of the metal-oxide regions, according to an embodiment of the present disclosure.
Figure 2B:
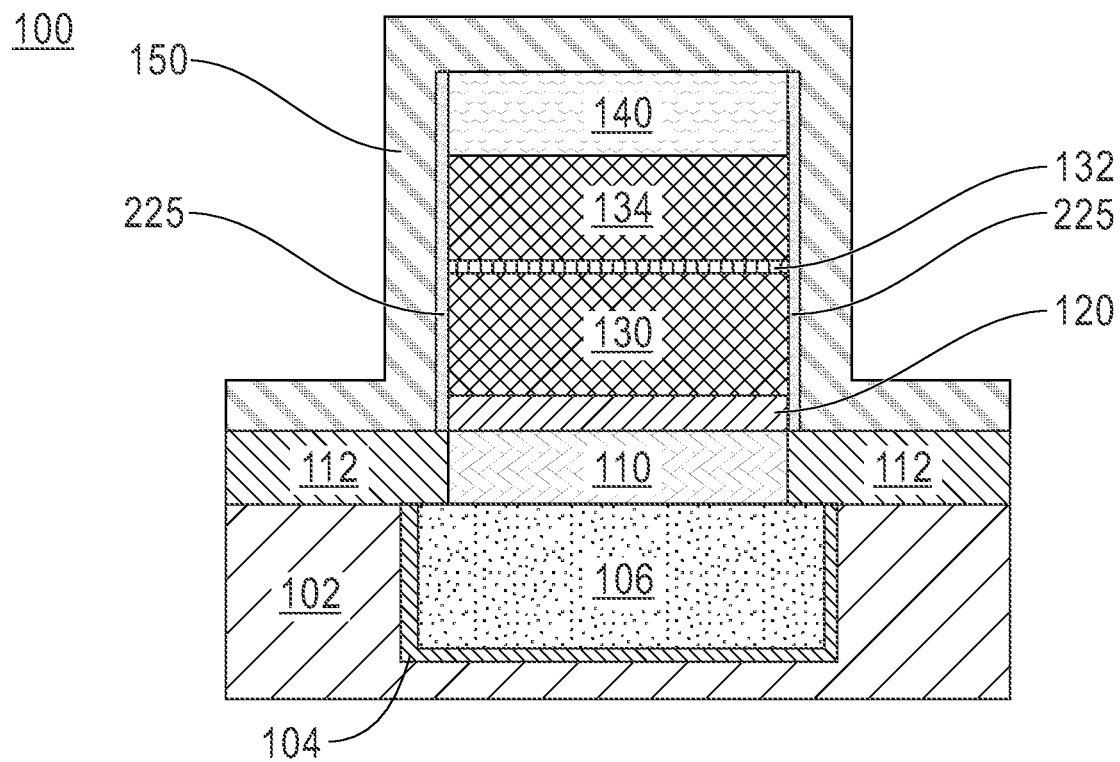
FIG. 2B is a cross-sectional view of the memory device after forming a spacer material, according to an embodiment of the present disclosure.
Figure 2C:
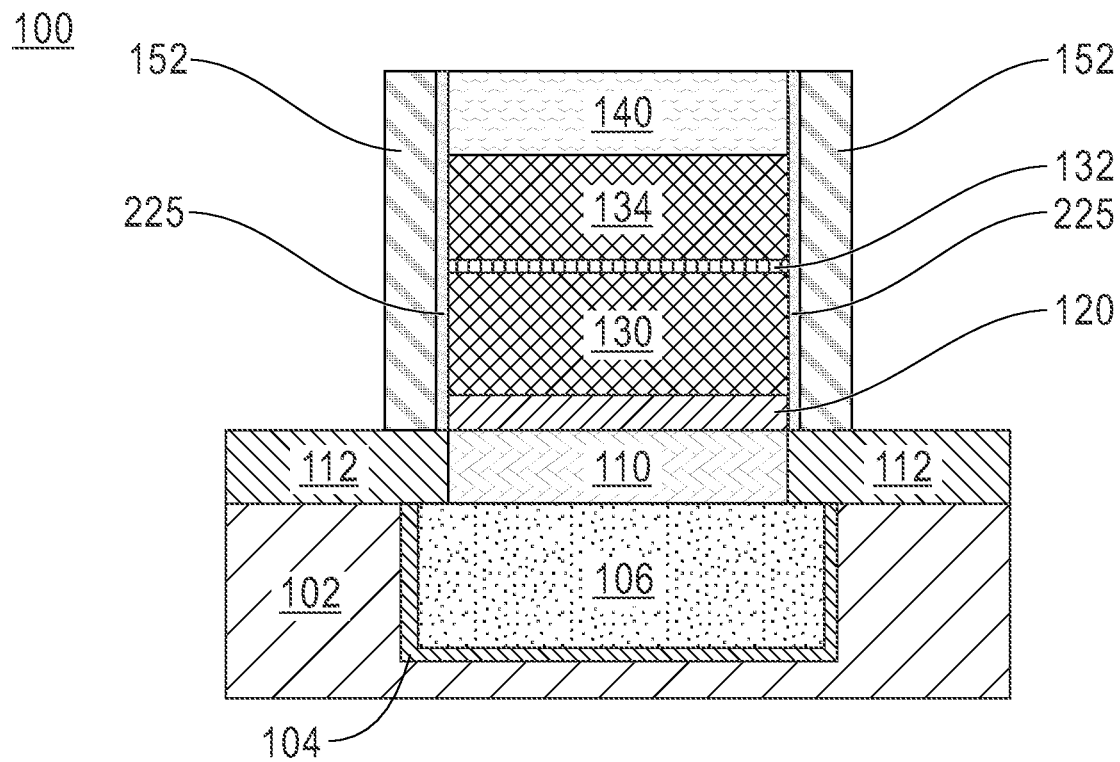
FIG. 2C is a cross-sectional view of the memory device after etching the spacer material and forming sidewall spacers, according to an embodiment of the present disclosure.
Figure 2D:
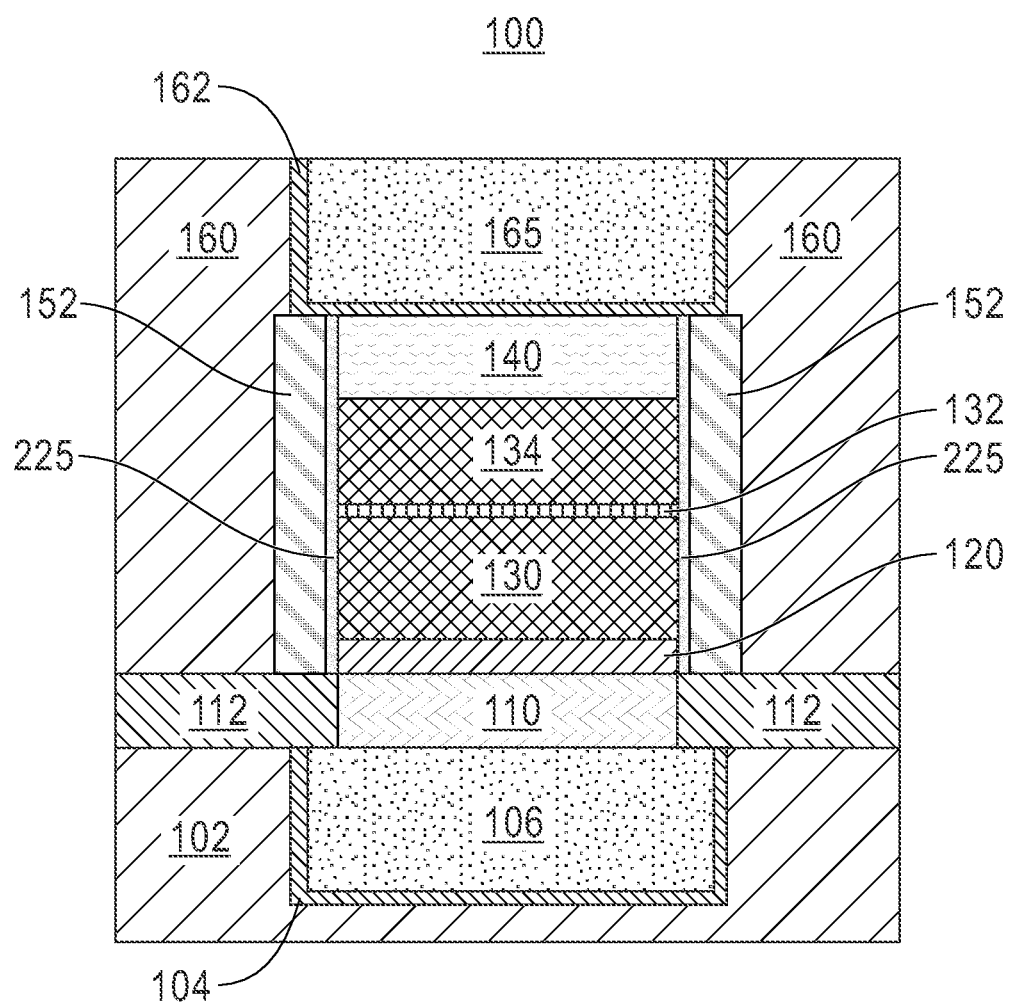
FIG. 2D is a cross-sectional view of the memory device after forming a third dielectric layer and a second conductive structure, according to an embodiment of the present disclosure.

After forming the first metal-oxide layer 225, the process continues by depositing the spacer material 150 (FIG. 2B) to form the sidewall spacers 152 (FIG. 2C) and then forming the second conductive structure 165 (FIG. 2D). It should be noted that the processing steps depicted in FIGS. 2B-2D are similar to the processing steps described in FIGS. 1I-1L above. Thus, details of previously described features and techniques have been omitted to avoid unnecessarily obscuring the presented embodiments.

The following described figures provide another embodiment by which a memory device 200 with segmented bottom electrode can be formed.

Figure 3A:
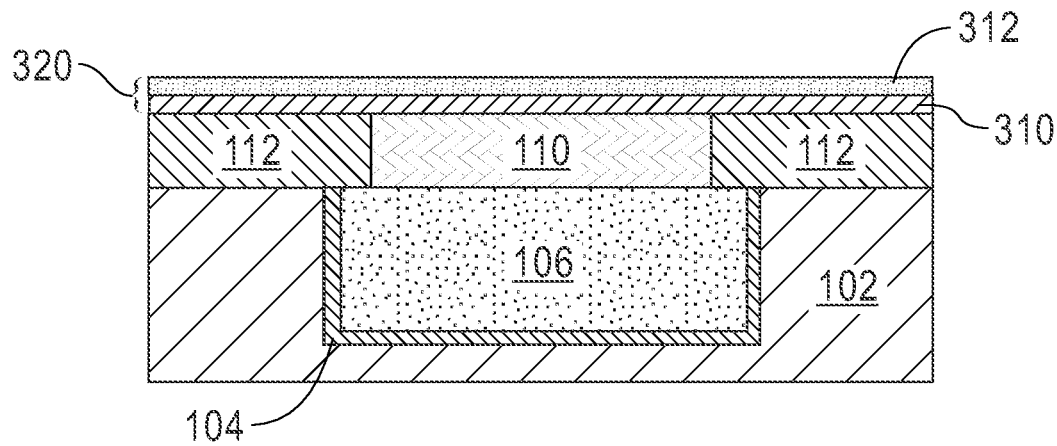
FIG. 3A is a cross-sectional view of a memory device after forming a bi-layer bottom electrode, according to another embodiment of the present disclosure.

Referring now to FIG. 3A, a cross-sectional view of a memory device 200 is shown at an intermediate step during a semiconductor manufacturing process, according to an embodiment of the present disclosure.

At this step of the manufacturing process, the memory device 200 includes substantially the same elements as the memory device 100 described above with reference to FIG. 1B. However, in the present embodiment, instead of the single-layer bottom electrode 120 shown in FIG. 1B, a bi-layer bottom electrode 320 composed of a first metal layer 310 and a first metal-nitride layer 312 is formed above the metal cap 110. The bi-layer bottom electrode 320 can be formed by depositing the first metal layer 310 followed by the first metal-nitride layer 312. In an exemplary embodiment, the first metal layer 310 is composed of a metal such as Ta, Mo, W or Ti, while the first metal-nitride layer 312 is composed of a metal nitride such as TaN, MoN, WN or TiN.

Non-limiting examples of deposition methods used to form the first metal layer 310 and the first metal-nitride layer 312 may include chemical vapor deposition (CVD), atomic layer deposition (ALD), physical vapor deposition (PVD), and the like. In an embodiment in which the first metal layer 310 is made of Ta and the first metal-nitride layer 312 is made of TaN, the first metal layer 310 and the first metal-nitride layer 312 can be formed in the same deposition chamber by, for example, PVD with alternating Ar vs. Ar/$N_2$ gas mixtures, or by CVD/ALD with alternating reactive gases such as $H_2$ vs $NH_3$.

Figure 3B:
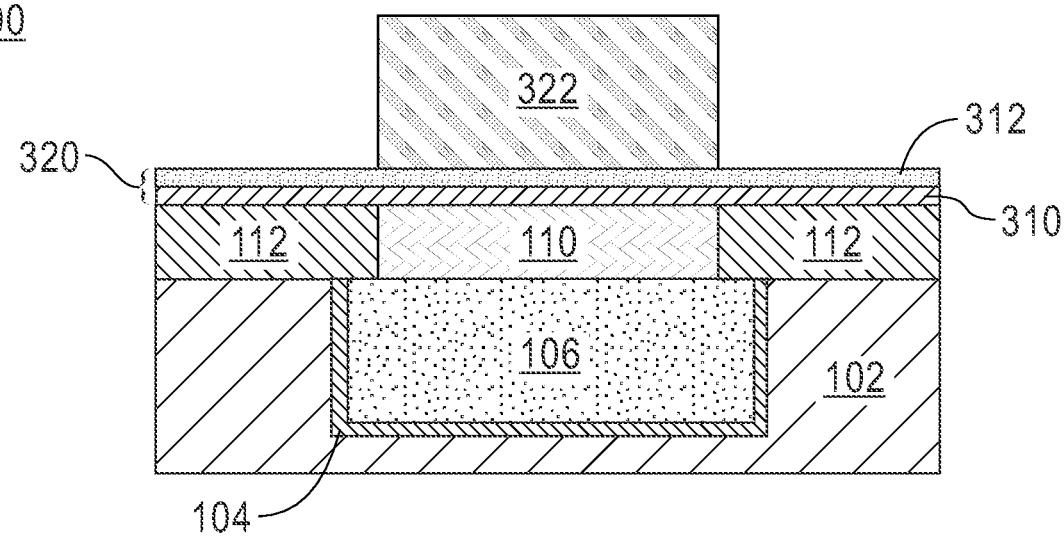
FIG. 3B is a cross-sectional view of the memory device after forming a second sacrificial pillar, according to another embodiment of the present disclosure.

Referring now to FIG. 3B, a cross-sectional view of the memory device 200 is shown after forming a second sacrificial pillar 322, according to an embodiment of the present disclosure.

At this step, a layer of dielectric material is formed above the bi-layer bottom electrode 320 using any suitable deposition technique. The deposited layer of dielectric material is then patterned to form the second sacrificial pillar 322 using standard patterning (lithography) and etching techniques. Non-limiting examples of dielectric materials to form the second sacrificial pillar 322 may include silicon oxide, silicon nitride, hydrogenated silicon carbon oxide, or silicon based low-k dielectrics. Similar to the first sacrificial pillar 122 depicted in FIG. 1C, the second sacrificial pillar 322 may protect underlying portions of the bi-layer bottom electrode 320 during a subsequent oxidation process. According to an embodiment a (horizontal) thickness of the second sacrificial pillar 322 may be selected based on design requirements and may vary between approximately 10 nm to approximately 200 nm, although other thicknesses above or below this range may be used as desired for a particular application.

Figure 3C:
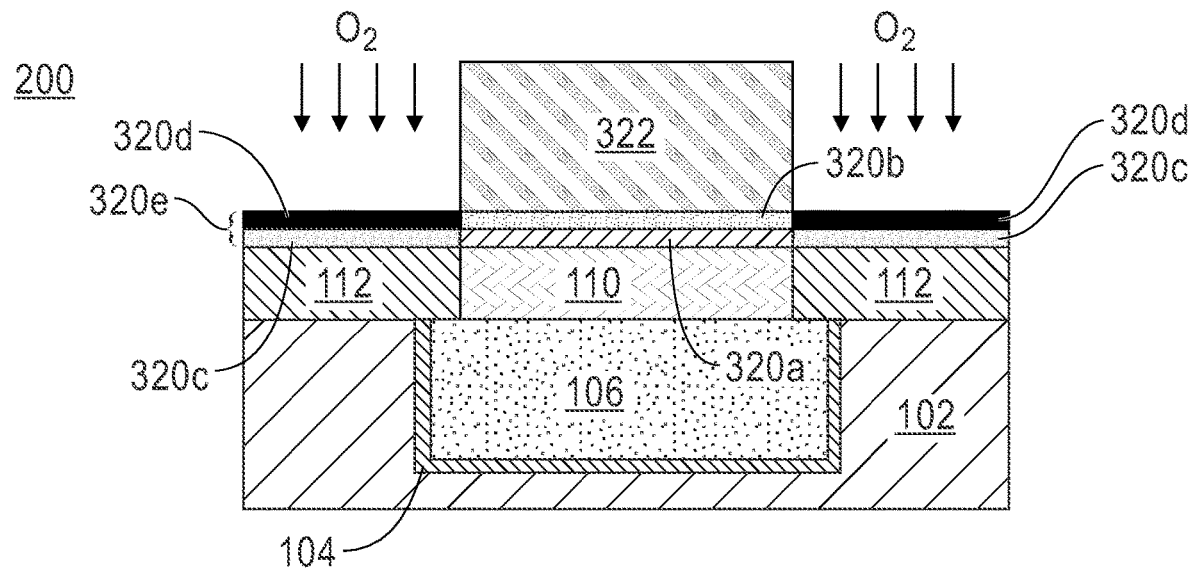
FIG. 3C is a cross-sectional view of the memory device after conducting an oxidation process on the bi-layer bottom electrode, according to another embodiment of the present disclosure.

Referring now to FIG. 3C, a cross-sectional view of the memory device 200 is shown after conducting an oxidation process on the bi-layer bottom electrode 320, according to an embodiment of the present disclosure.

In this embodiment, the oxidation process is conducted on exposed (outer) portions of the bi-layer bottom electrode 320 (FIG. 3B). Specifically, the oxidation process is conducted on regions of the bi-layer bottom electrode 320 (FIG. 3B) not covered by the second sacrificial pillar 322. As described above, the second sacrificial pillar 322 protects underlying (inner) portions of the bi-layer bottom electrode 320 during the oxidation process. In one or more embodiments, the oxidation process includes thermal/plasma exposure of the outer portions of the bi-layer bottom electrode 320 (FIG. 3B) to $O_2$, $H_2O$ and/or $NO_x$ in the presence of the second sacrificial pillar 322.

After completing the oxidation process, the bi-layer bottom electrode 320 depicted in FIG. 3B becomes a second segmented bottom electrode 320e composed of an (inner) metal region 320a located right above the metal cap 110, an (inner) metal-nitride region 320b located underneath the second sacrificial pillar 322 and above the metal region 320a, a first (outer) metal-oxide region 320c, and a second (outer) metal-oxide region 320d above the first metal-oxide region 320c.

In an exemplary embodiment in which the first metal layer 310 of the bi-layer bottom electrode 320 (FIG. 3B) includes Ta and the first metal-nitride layer 312 of the bi-layer bottom electrode 320 (FIG. 3B) includes TaN, after the oxidation process, the metal region 320a and the metal-nitride region 320b located under the second sacrificial pillar 322 include Ta and TaN, respectively, while the first metal-oxide region 320c and the second metal-oxide region 320d not covered by the second sacrificial pillar 322 include $TaO_x$ and $TaNO_x$, respectively. The first and second metal-oxide regions 320c, 320d can prevent back-sputtering of conductive metal particles during etching of a subsequently formed MTJ stack, as will be described in detail below.

Figure 3D:
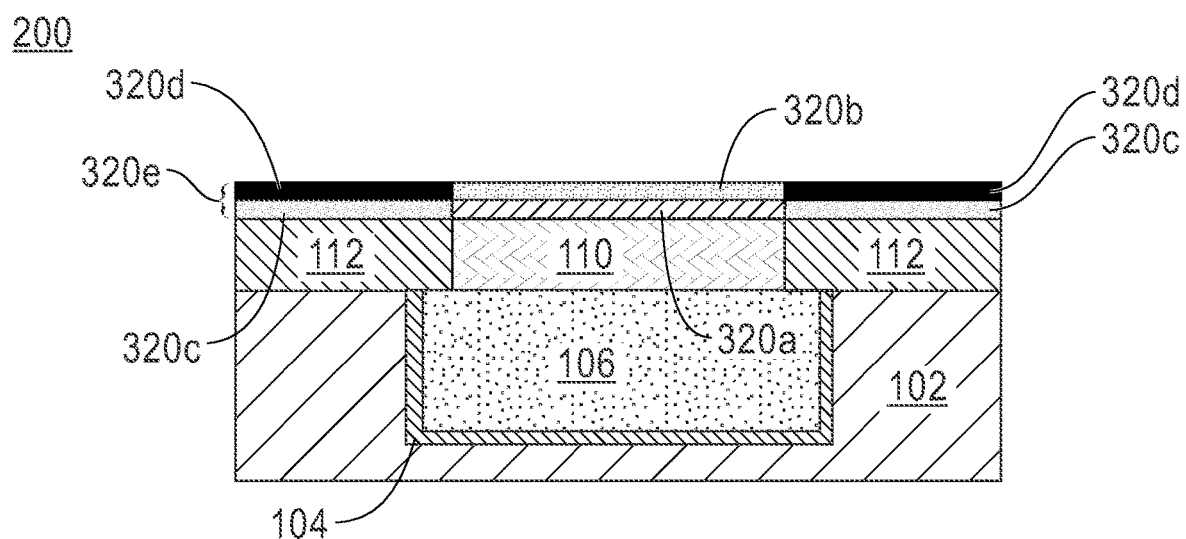
FIG. 3D is a cross-sectional view of the memory device after removing the second sacrificial pillar, according to another embodiment of the present disclosure.

Referring now to FIG. 3D, a cross-sectional view of the memory device 200 is shown after removing the second sacrificial pillar 322, according to an embodiment of the present disclosure. The second sacrificial pillar 322 can be removed using any suitable etching technique such as, for example, reactive ion etching (RIE). Removal of the second sacrificial pillar 322 exposes an uppermost surface of the second segmented bottom electrode 320e.

Figure 3E:
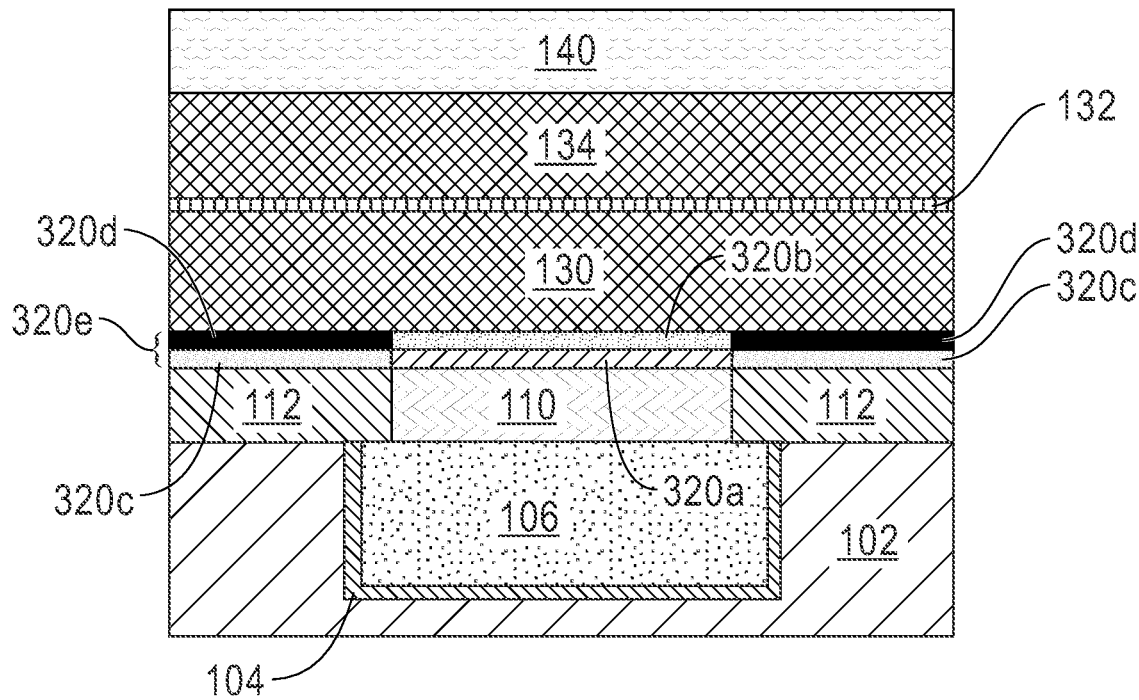
FIG. 3E is a cross-sectional view of the memory device after forming the magnetic tunnel junction stack and the hardmask layer, according to another embodiment of the present disclosure.
Figure 3F:
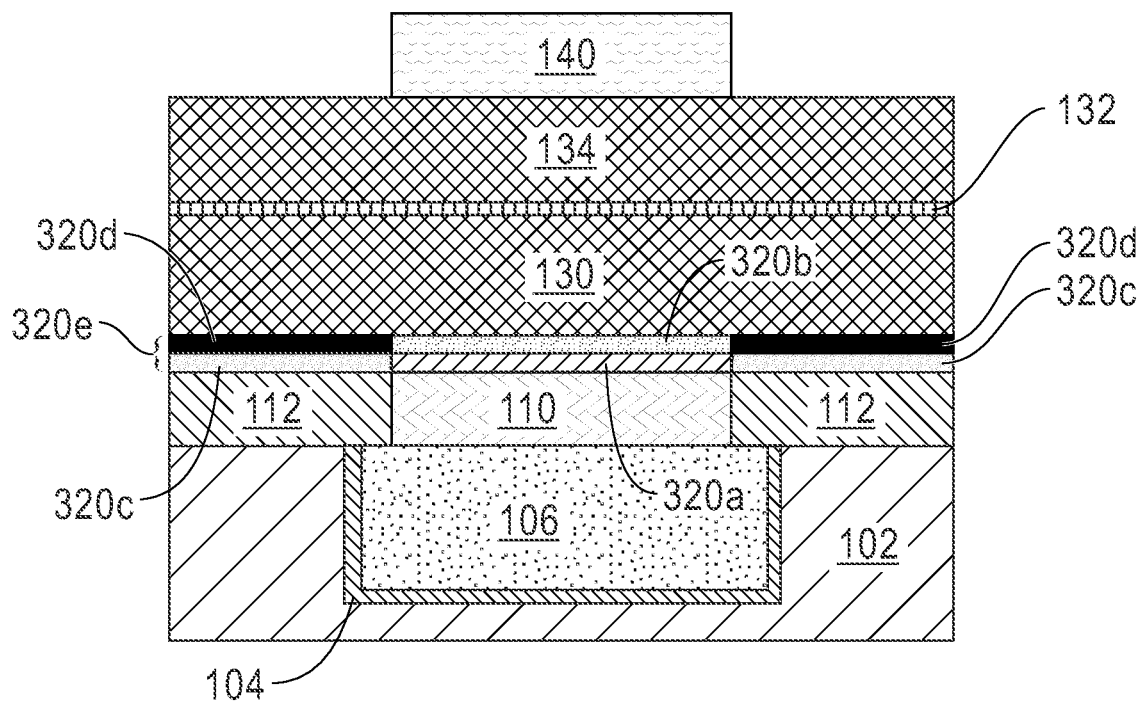
FIG. 3F is a cross-sectional view of the memory device after patterning the hardmask layer, according to another embodiment of the present disclosure.
Figure 3G:
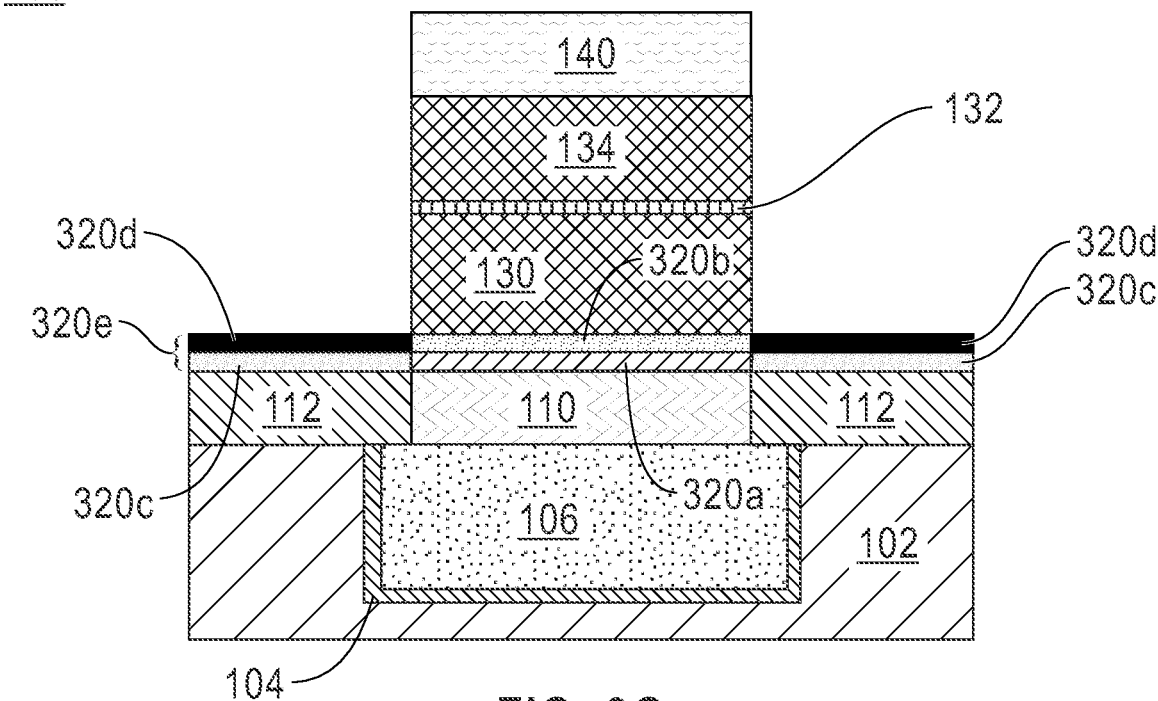
FIG. 3G is a cross-sectional view of the memory device after patterning the magnetic tunnel junction stack to form a magnetic tunnel junction pillar, according to another embodiment of the present disclosure.

Referring now to FIGS. 3E-3G simultaneously, cross-sectional views of the memory device 200 are shown after forming the MTJ stack 10 above the second segmented bottom electrode 320e, patterning the hardmask layer 140 and patterning the MTJ stack 10, according to an embodiment of the present disclosure.

It should be noted that after forming the second segmented bottom electrode 320e, the subsequent processing steps are similar to those described in FIGS. 1F-1L above. Particularly, the steps of forming the MTJ stack 10 above the second segmented bottom electrode 320e, patterning the hardmask layer 140 and patterning the MTJ stack 10 have been described in detail above. Thus, details of previously described features and techniques have been omitted to avoid unnecessarily obscuring the presented embodiments.

As described above, the process of patterning the hardmask layer 140 and MTJ stack 10 consists of steps well-known in the art, which generally include forming a pattern on a photoresist layer (not shown) that is transferred to the hardmask layer 140 (FIG. 1G) and used to pattern the underlying MTJ stack 10 (FIG. 1H) via any suitable etching technique. Non-limiting examples of etching techniques for patterning the MTJ stack 10 may include reactive-ion etching (RIE) or ion beam etching (IBE). In this embodiment, etching of the MTJ stack 10 is conducted until a top surface of the second metal-oxide region 320d. As previously mentioned, the first and second metal-oxide regions 320c, 320d of the second segmented bottom electrode 320e can prevent back-sputtering of conductive metal particles during etching of the MTJ stack 10 (FIG. 3G) to form the MTJ pillar 12.

Figure 3H:
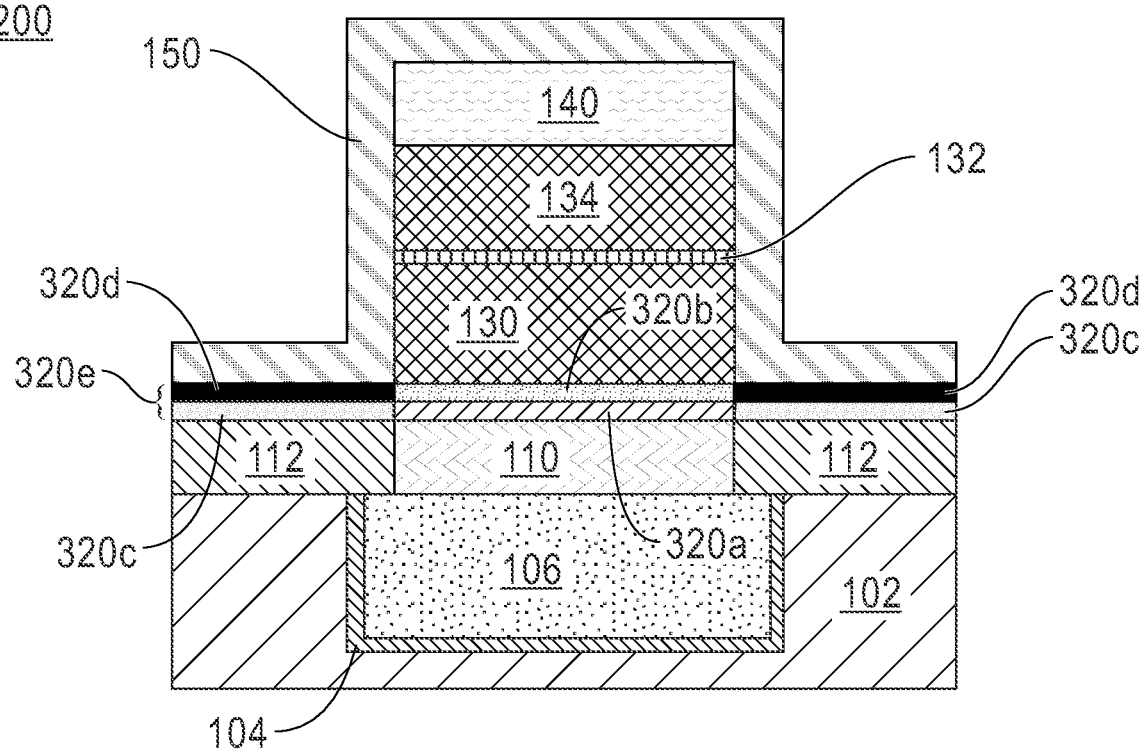
FIG. 3H is a cross-sectional view of the memory device after forming the spacer material, according to another embodiment of the present disclosure.
Figure 3I:
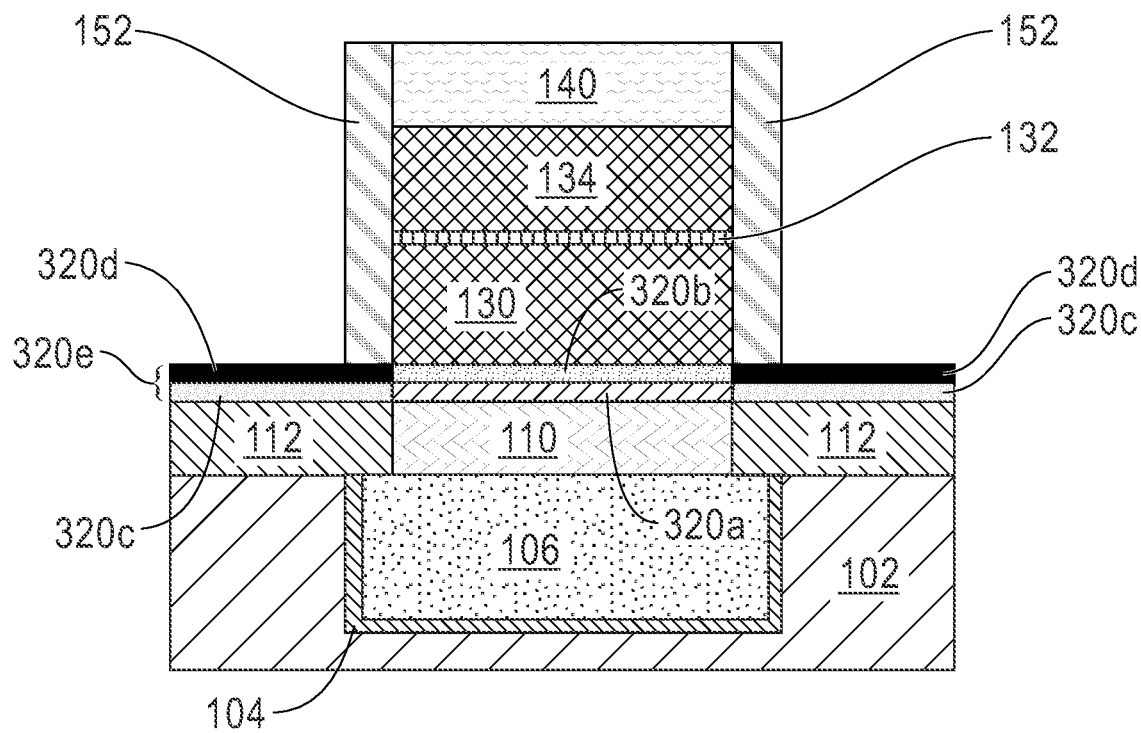
FIG. 3I is a cross-sectional view of the memory device after etching the spacer material and forming sidewall spacers, according to another embodiment of the present disclosure.
Figure 3J:
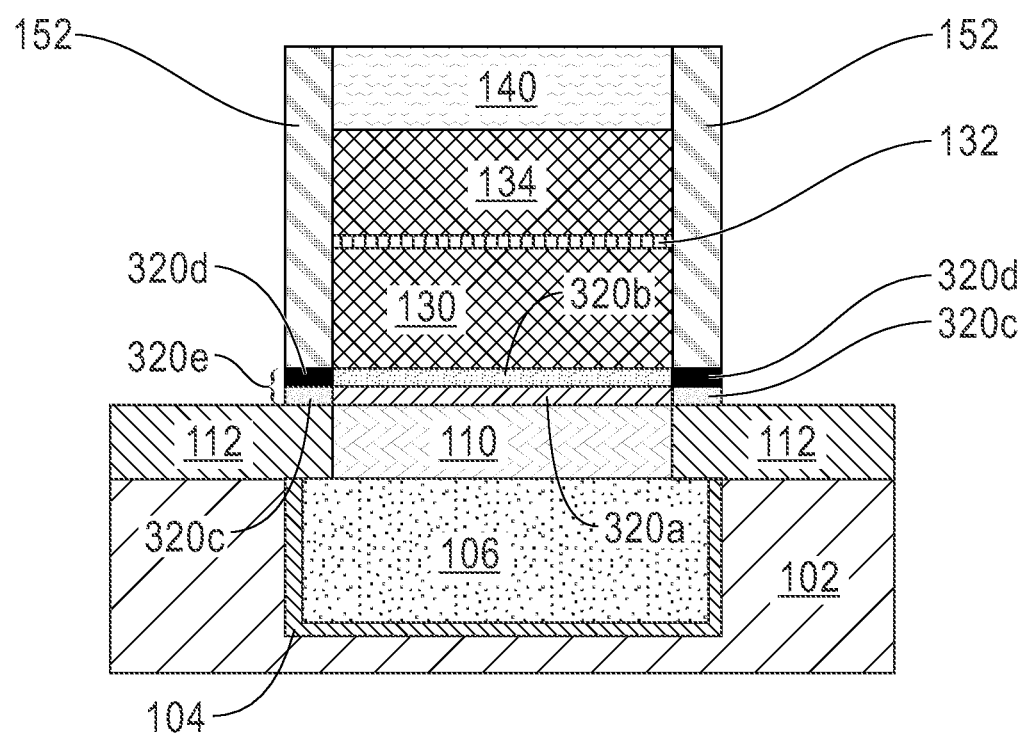
FIG. 3J is a cross-sectional view of the memory device after etching outer portions of bi-layer metal-oxide regions, according to another embodiment of the present disclosure.

Referring now to FIGS. 3H-3I simultaneously, cross-sectional views of the memory device 200 are shown after forming the spacer material 150 and etching the spacer material 150 to form the sidewall spacers 152, according to an embodiment of the present disclosure. The steps of forming the spacer material 150 and etching the spacer material 150 to form the sidewall spacers 152 have been described in detail above. Thus, details of previously described features and techniques have been omitted to avoid unnecessarily obscuring the presented embodiments.

As can be observed in FIG. 3I, in this embodiment, a bottom surface of the sidewall spacers 152 is in contact with a portion of the second metal-oxide regions 320d of the second segmented bottom electrode 320e.

Referring now to FIG. 1J, a cross-sectional view of the memory device 200 is shown after etching exposed portions of the first and second metal-oxide regions 320c, 320d of the second segmented bottom electrode 320e, according to an embodiment of the present disclosure.

In this embodiment, dry etching techniques such as reactive ion etch (RIE) or ion beam etch (IBE) can be used to etch portions of the first and second metal-oxide regions 320c, 320d of the second segmented bottom electrode 320e extending outwards from the sidewall spacers 152. Stated differently, areas of the first and second metal-oxide regions 320c, 320d of the second segmented bottom electrode 320e not covered by the sidewalls spacers 152 are removed from the memory device 200. It should be noted that areas of the first and second metal-oxide regions 320c, 320d underneath the sidewalls spacers 152 remain in the memory device 200.

Figure 3K:
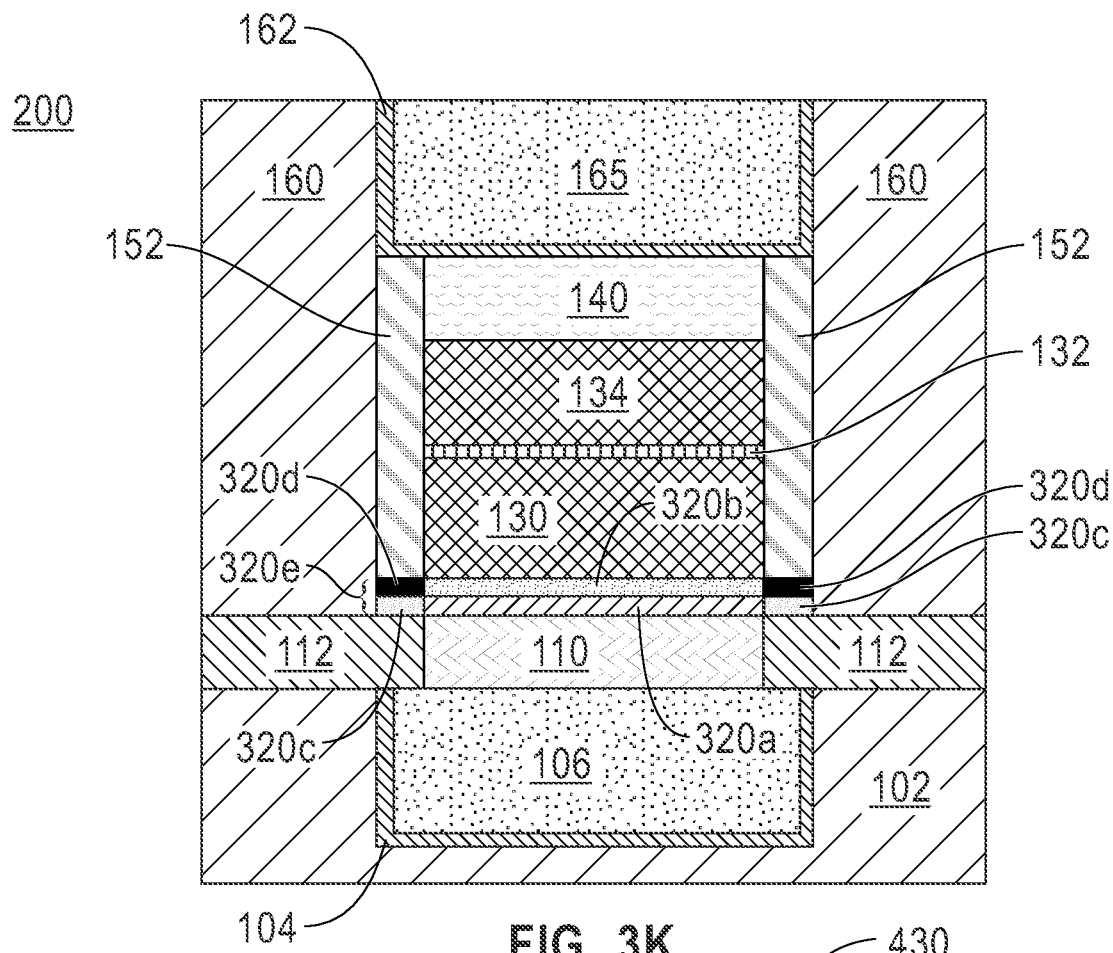
FIG. 3K is a cross-sectional view of the memory device after forming the third dielectric layer and the second conductive structure, according to another embodiment of the present disclosure.

Referring now to FIG. 3K, a cross-sectional view of the memory device 200 is shown after forming the third dielectric layer 160 and the second conductive structure 165, according to an embodiment of the present disclosure. The steps of forming the third dielectric layer 160 and the second conductive structure 165 have been described in detail above. Thus, details of previously described features and techniques have been omitted to avoid unnecessarily obscuring the presented embodiments.

The memory device 200 as depicted in FIG. 3K includes a second segmented bottom electrode 320e consisting of a metal/metal nitride bi-layer (i.e., metal region 320a and metal-nitride region 320b) underneath the MTJ pillar 12 and a metal-oxide bi-layer (i.e., first and second metal-oxide regions 320c, 320d) outside the MTJ pillar 12 below the sidewall spacers 152. In the embodiments of FIGS. 3A-3K, the bottom electrode layer may be composed of a Ta/TaN bi-layer and the metal-oxide layer outside the MTJ pillar 12 may be composed of TaOx/TaNOx bi-layer (i.e., the oxide of the adjacent metal bi-layer).

Alternatively or additionally, a re-sputtering process of the exposed first and second metal-oxide regions 320c, 320d of the second segmented bottom electrode 320e depicted in FIG. 3I can be performed after conducting the steps of forming the second segmented bottom electrode 320e and patterning the MTJ stack 10 (FIGS. 3D-3G), as will be described in detail below with reference to FIGS. 4A-4D.

Referring now to FIGS. 4A-4D simultaneously, cross-sectional views of the memory device 200 are shown after re-sputtering of the first and second metal-oxide regions 320c, 320d of the second segmented bottom electrode 320e depicted in FIG. 3I, according to an alternate embodiment of the present disclosure.

After conducting the steps of forming the second segmented bottom electrode 320e and patterning the MTJ pillar 12 (FIGS. 3D-3G), the exposed first and second metal-oxide regions 320c, 320d of the second segmented bottom electrode 320e depicted in FIG. 3G can be re-sputtered onto sidewalls of the MTJ pillar 12 to form a second metal-oxide layer 430, as depicted in the figure.

In this embodiment, the second metal-oxide layer 430 may be composed of a metal-oxide bi-layer. Specifically, the second metal-oxide layer 430 includes a metal-oxide layer 422 from the re-sputtered second metal-oxide region 320d and a metal-oxide layer 424 from the re-sputtered first metal-oxide region 320c. The re-sputtered metal-oxides (e.g., TaOx and TaNOx) from the exposed first and second metal-oxide regions 320c, 320d of the second segmented bottom electrode 320e depicted in FIG. 3I may deposit on sidewalls of the MTJ pillar 12. More particularly, in one or more embodiments, the etching process used to pattern the MTJ pillar 12 (described above with reference to FIGS. 1H and 3I) may continue until a top surface of the second dielectric layer 112. By doing this, the re-sputter metal-oxides may deposit along sidewalls of the MTJ pillar 12 forming the second metal-oxide layer 430 composed of the metal-oxide layers 422, 424, as illustrated by second arrows 420 in FIG. 4A. The second metal-oxide layer 430 may prevent shorts across the tunnel barrier of the MTJ pillar 12.

Figure 4A:
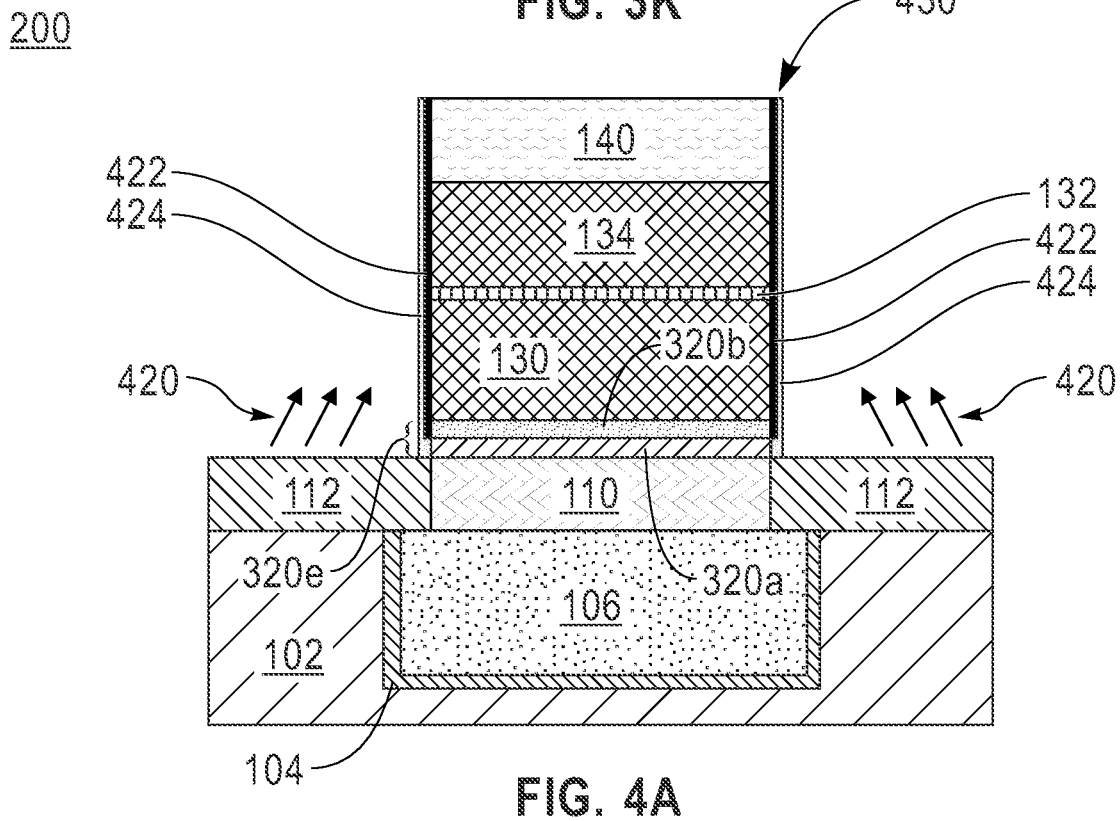
FIG. 4A is a cross-sectional view of the memory device after re-sputtering of the bi-layer metal-oxide regions, according to another embodiment of the present disclosure.
Figure 4B:
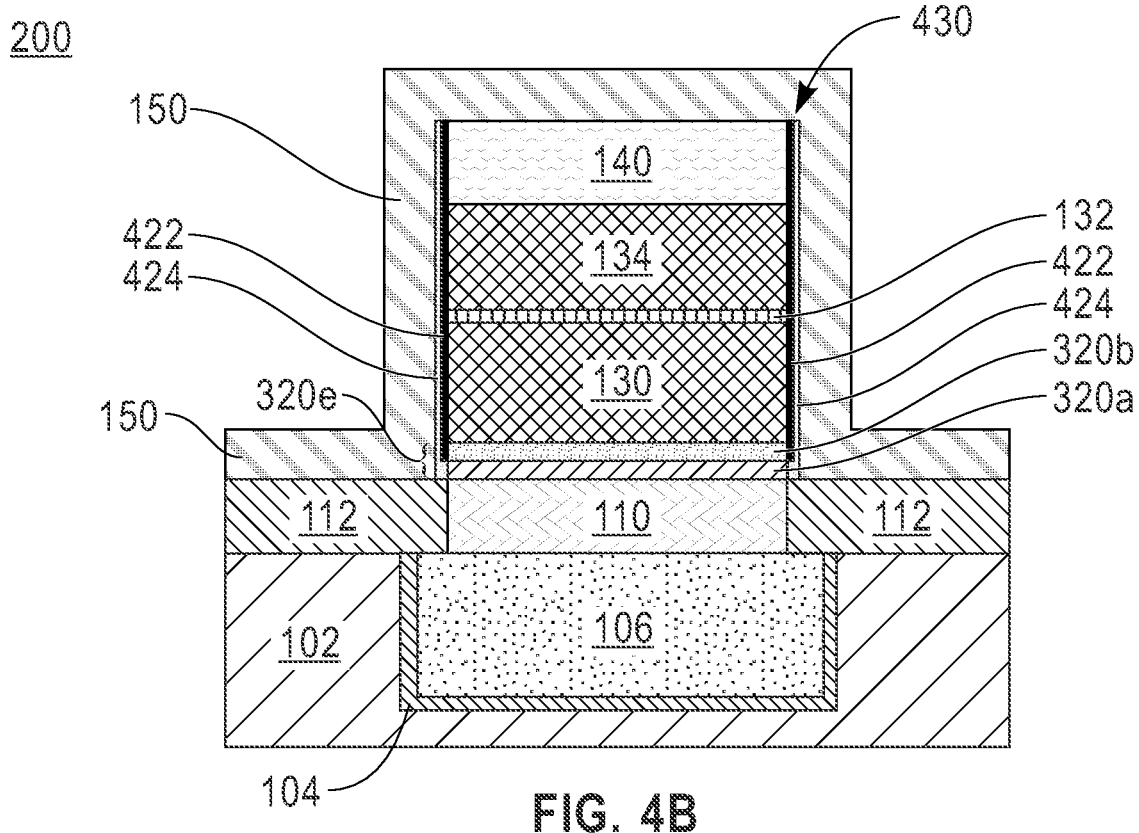
FIG. 4B is a cross-sectional view of the memory device after forming the spacer material, according to another embodiment of the present disclosure.
Figure 4C:
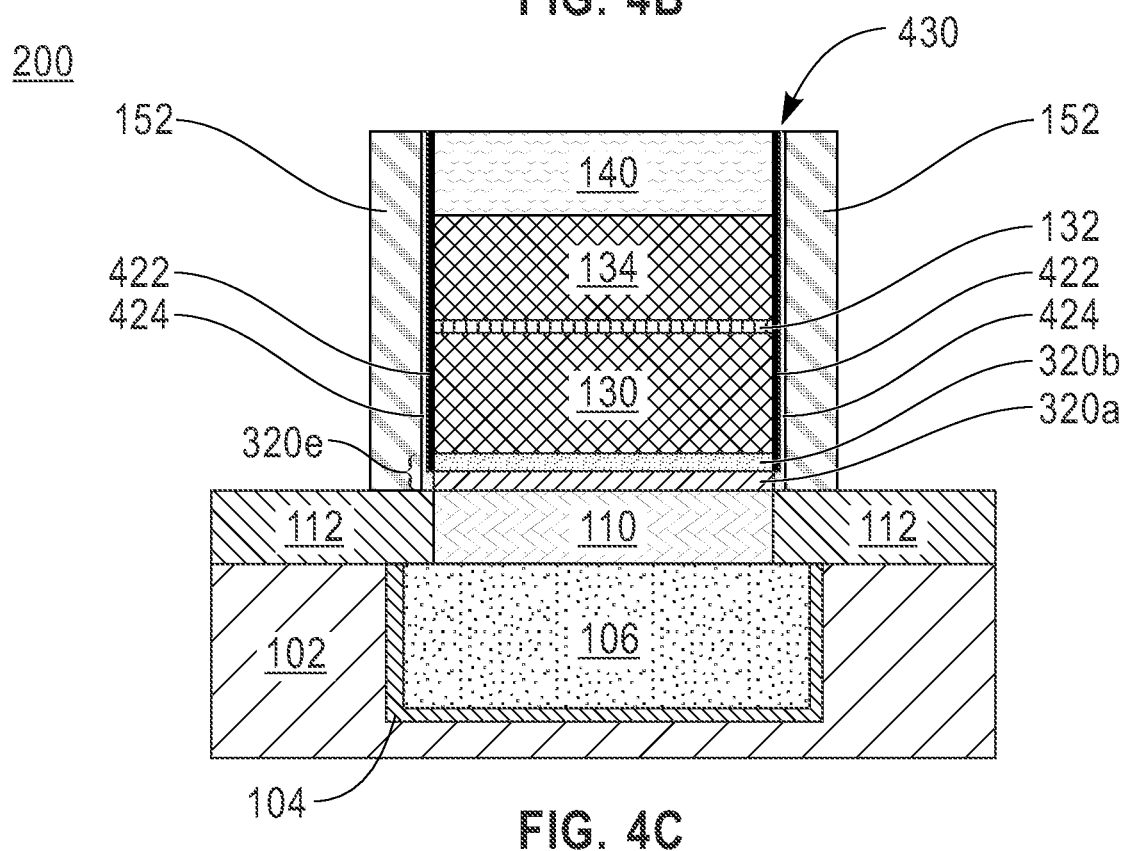
FIG. 4C is a cross-sectional view of the memory device after etching the spacer material and forming sidewall spacers, according to another embodiment of the present disclosure.
Figure 4D:
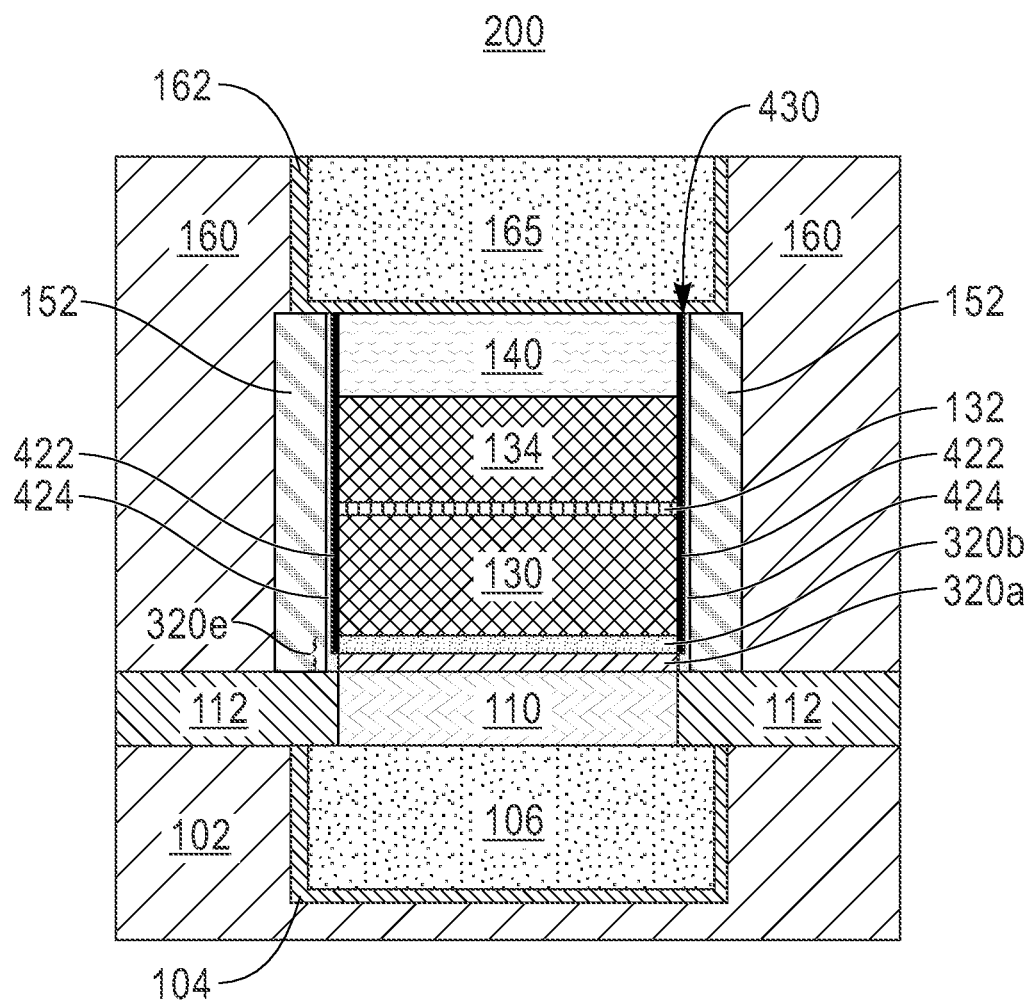
FIG. 4D is a cross-sectional view of the memory device after forming the third dielectric layer and the second conductive structure, according to another embodiment of the present disclosure.

After forming the second metal-oxide layer 430, the process continues by depositing the spacer material 150 (FIG. 4B) to form the sidewall spacers 152 (FIG. 4C) and then forming the second conductive structure 165 (FIG. 4D). It should be noted that the processing steps depicted in FIGS. 4B-4D are similar to the processing steps described in FIGS. 1I-1L above. Thus, details of previously described features and techniques have been omitted to avoid unnecessarily obscuring the presented embodiments.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Spatially relative terms, such as "inner," "outer," "beneath," "below," "lower," "above," "upper," "top," "bottom," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory device, comprising:
a magnetic tunnel junction pillar above a first portion of a segmented bottom electrode, the first portion of the segmented bottom electrode comprising a metal region; and
a sidewall spacer along sidewalls of the magnetic tunnel junction pillar, the sidewall spacer being above a second portion of the segmented bottom electrode, the second portion of the segmented bottom electrode comprising a metal-oxide region.

2. The memory device of claim 1, further comprising:
a first conductive structure within a first dielectric layer; and
a metal cap above the first conductive structure, the metal cap being formed within a second dielectric layer located above the first dielectric layer, the segmented bottom electrode being located above the metal cap.

3. The memory device of claim 1, further comprising:
a hardmask layer above the magnetic tunnel junction pillar.

4. The memory device of claim 1, further comprising:
a second conductive structure above the magnetic tunnel junction pillar, the second conductive structure being located within a third dielectric layer.

5. The memory device of claim 1, wherein the metal region of the segmented bottom electrode is below the magnetic tunnel junction pillar and comprises a single layer of a first conductive metal including at least one of Ta, TaN, Ti, TiN, Ru, RuN, RuTa, RuTaN, W, and WN.

6. The memory device of claim 5, wherein the metal-oxide region of the segmented bottom electrode is outside the magnetic tunnel junction pillar below the sidewall spacer and comprises a single layer of a first oxide of the first conductive metal in the adjacent metal region.

7. The memory device of claim 6, wherein the first oxide of the first conductive metal in the adjacent metal region comprises TaOx when the first conductive metal in the metal region comprises Ta.

8. The memory device of claim 1, wherein the metal region of the segmented bottom electrode is below the magnetic tunnel junction pillar and comprises a metal/metal nitride bi-layer including a layer of a second conductive metal and a layer of a nitride of the second conductive metal above the layer of the second conductive metal.

9. The memory device of claim 8, wherein the second conductive metal comprises at least one of Ta, Ti, Ru, and W.

10. The memory device of claim 8, wherein the metal-oxide region of the segmented bottom electrode is outside the magnetic tunnel junction pillar below the sidewall spacer and comprises a bi-layer of oxides of the second conductive metal and the nitride of the second conductive metal in the adjacent metal region.

11. The memory device of claim 10, wherein the bi-layer of oxides comprising the second conductive metal and the nitride of the second conductive metal in the adjacent metal region are made of TaOx and TaNOx, respectively, and the metal/metal nitride bi-layer comprising the second conductive metal and the nitride of the second conductive metal in the metal region comprises Ta and TaN, respectively.

12. The memory device of claim 1, wherein the metal-oxide region is formed by oxidizing the second portion of the segmented bottom electrode by thermal/plasma exposure to at least one of $O_2$, $H_2O$ and $NO_x$.

13. A memory device, comprising:
a magnetic tunnel junction pillar above an inner region of a segmented bottom electrode, the inner region of the segmented bottom electrode comprising a metal region; and
a sidewall spacer along sidewalls of the magnetic tunnel junction pillar, the sidewall spacer being above an outer region of the segmented bottom electrode, the outer region of the segmented bottom electrode comprising a metal-oxide region.

14. The memory device of claim 13, further comprising:
a first conductive structure within a first dielectric layer; and
a metal cap above the first conductive structure, the metal cap being formed within a second dielectric layer located above the first dielectric layer, the inner region of the segmented bottom electrode being located above the metal cap.

15. The memory device of claim 13, further comprising:
a hardmask layer above the magnetic tunnel junction pillar.

16. The memory device of claim 13, further comprising:
a second conductive structure above the magnetic tunnel junction pillar, the second conductive structure being located within a third dielectric layer.

17. The memory device of claim 13, wherein the metal region is below the magnetic tunnel junction pillar and comprises a single layer of a first conductive metal including at least one of Ta, TaN, Ti, TiN, Ru, RuN, RuTa, RuTaN, W, and WN.

18. The memory device of claim 17, wherein the metal-oxide region of the outer region comprises a single layer of a first oxide of the first conductive metal in the adjacent metal region.

19. The memory device of claim 18, wherein the first oxide of the first conductive metal in the adjacent metal region comprises TaOx when the first conductive metal in the metal region comprises Ta.

20. The memory device of claim 13, wherein the metal-oxide region is formed by oxidizing the outer portion of the segmented bottom electrode by thermal/plasma exposure to at least one of $O_2$, $H_2O$ and $NO_x$.

* * * * *